(12) United States Patent
Tsuda et al.

(10) Patent No.: US 6,873,213 B2
(45) Date of Patent: Mar. 29, 2005

(54) FRACTIONAL N FREQUENCY SYNTHESIZER

(75) Inventors: Kazutoshi Tsuda, Tokyo (JP); Yutaka Takahashi, Tokyo (JP)

(73) Assignee: NEC Compound Semiconductor Devices, Ltd., Kanagawa (JP)

( * ) Notice: Subject to any disclaimer, the term of this patent is extended or adjusted under 35 U.S.C. 154(b) by 165 days.

(21) Appl. No.: 10/261,904

(22) Filed: Oct. 1, 2002

(65) Prior Publication Data

US 2003/0062959 A1 Apr. 3, 2003

(30) Foreign Application Priority Data

Oct. 2, 2001 (JP) .................................. 2001-306745

(51) Int. Cl.⁷ .............................. H03L 7/08; H03L 7/18
(52) U.S. Cl. .......................... 331/1 A; 331/16; 331/18; 331/25
(58) Field of Search .................. 331/1 A, 16–18, 331/25; 327/156–159, 117; 360/51; 375/376; 455/260

(56) References Cited

U.S. PATENT DOCUMENTS 5,777,521 A  7/1998  Gillig et al.
5,781,044 A  * 7/1998  Riley et al. .................. 327/105

FOREIGN PATENT DOCUMENTS

JP   10-163860   6/1998

OTHER PUBLICATIONS

Translation of indicated portions of Japanese Office Action of Dec. 18, 2003.

* cited by examiner

*Primary Examiner*—David Mis
(74) *Attorney, Agent, or Firm*—Darryl G. Walker; Bradley T. Sako

(57) ABSTRACT

A frequency synthesizer (100) that may have reduced spurious noise caused by a voltage controlled oscillator (VCO) (4) output sneaking into an input side of a phase comparison circuit (1) has been disclosed. A beat frequency component that may be generated by mixing of a portion of a VCO output sneaking into an input side of a phase comparison circuit (1) through a reference signal (REF) or a comparison signal (SIG) may be shifted to a high frequency region by providing a modulator circuit (7) on a reference signal side or a comparison signal side. Thus, a low pass filter circuit (3) may provide attenuation to the spurious noise. In this way, spurious noise in the VCO output may be reduced.

20 Claims, 20 Drawing Sheets

(a)

| F(MSB) | F(MSB-1) | REFS |
|---|---|---|
| 0 | 0 | REFM |
| 0 | 1 | REF |
| 1 | 0 | REF |
| 1 | 1 | REFM |

(b)

(a)

(b)

US 6,873,213 B2

FRACTIONAL N FREQUENCY SYNTHESIZER

TECHNICAL FIELD

The present invention relates generally to a frequency synthesizer that may perform fractional control and more particularly to a fractional frequency synthesizer that may decrease spurious noise in a voltage controlled oscillator output.

BACKGROUND OF THE INVENTION

It is desirable to reduce component count and current consumption of a radio section in portable telephones or the like. To address these needs, a kind of frequency synthesizer to switch between frequency channels (CH) for transmitting and receiving has been used.

Referring now to FIG. 21(a), a block schematic diagram of a conventional N frequency synthesizer is set forth and given the general reference character 2100. Conventional N frequency synthesizer 2100 is an integer frequency dividing circuit with examples of numerical values of frequency shown within parentheses.

Conventional N frequency synthesizer 2100 includes a phase comparator (PD) 1A, a charge pump (CP) 2A, a low pass filter (LPF) 3A, a voltage controlled oscillator (VCO) 4A, and a frequency dividing circuit 5A. Frequency dividing circuit 5A is able to switch between frequency dividing numbers of integers.

Phase comparator 1A receives a reference signal REF and a comparison signal SIG. Comparison signal SIG is obtained by dividing an output signal OUT of voltage controlled oscillator 4A with frequency dividing circuit 5A. Phase comparator 1A detects a phase difference between reference signal REF and comparison signal SIG and provides an output to output terminals provided as inputs to charge pump 2A. The outputs of phase comparator 1A are phase error signals which are different in polarity in accordance with the directions (lagging or leading) of phase between comparison signal SIG and reference signal REF. Furthermore, the phase error signals have a pulse width in accordance with the magnitude of phase difference between comparison signal SIG and reference signal REF.

Charge pump 2A receives the phase error signals and provides a signal CPOUT having a pulse width and polarity in accordance with phase error signals corresponding to the phase difference between comparison signal SIG and reference signal REF. Low pass filter (LPF) 3A extracts a low frequency component of signal CPOUT to provide an output received as an input to voltage controlled oscillator (VCO) 4A. VCO 4A provides an output OUT having an oscillation frequency in accordance with the output of LPF 3A. Frequency dividing circuit 5A divides output OUT by a frequency number N to provide comparison signal SIG.

Conventional N frequency synthesizer 2100 performs a feedback operation to lock the output frequency of VCO 4A so that the output of frequency divider circuit 5A (comparison signal SIG) obtained by dividing the output signal OUT of VCO 4A by a frequency dividing number N (an integer) may conform with the frequency (fref) of reference signal REF. Therefore, conventional frequency synthesizer 2100 can provide an output signal OUT of a frequency (N×fref) which is N times higher than the frequency of the reference signal REF. In this way, a channel frequency can be output having a frequency that is an integer multiple of a frequency (fref) of a reference signal REF by setting the integer N. FIG. 21(b) is a frequency diagram indicating frequencies of output signal OUT set by setting a value of N.

However, by using an integer N to set the frequency of an output signal OUT with respect to the reference signal REF, the frequency (fref) of reference signal REF is required to be identical to the difference in frequency between channels. For this reason, the frequency (fref) of reference signal REF is limited and cannot be a high frequency. Thus, the loop bandwidth becomes narrow and it may be impossible to realize high-speed locking in switching of channels or the like.

For this reason, a conventional fractional N frequency synthesizer has been proposed which uses a frequency dividing circuit which can be operated to switch among dividing operations by frequency dividing numbers of a plurality of different integers and thus performs frequency dividing with a frequency dividing number of a non-integer on average (dividing by a non-integer or dividing by a fraction). In this way, the generation of a voltage controlled oscillator output of a desired frequency is performed while allowing the frequency of a reference signal to be increased to permit high speed locking.

Referring now to FIG. 22, a block schematic diagram of a conventional N frequency synthesizer is set forth and given the general reference character 2200. Conventional N frequency synthesizer 2200 includes the basic configuration of conventional N frequency synthesizer 2100 that forms a phase locked loop (PLL). However, conventional N frequency synthesizer 2200 uses a frequency dividing circuit 5B that is able to perform frequency dividing by a frequency dividing number which can be switched to any one of frequency dividing numbers from N to N+1. Conventional N frequency synthesizer 2200 also includes a frequency dividing number control circuit 6B. Frequency dividing number control circuit 6B controls the frequency dividing number of frequency dividing circuit 5B on a time sequence basis according to a signal sequence n.

Frequency dividing number control circuit 6B receives a value (N+F/M, where N, F, M are positive integers) for the frequency dividing number of a non-integer and outputs a signal sequence n of the values of frequency dividing numbers on a time sequence basis to frequency dividing circuit 5B. Frequency dividing number control circuit 6B and frequency dividing circuit 5B provide a frequency dividing operation based on a fractional control performing non-integer frequency dividing operation from a time average value produced by switching among a plurality of integer frequency dividing operations. To do this, a type of sigma-delta moderation circuit having a noise shaping effect that is capable of removing pattern noise is used for frequency dividing number control circuit 6B to provide signal sequence n. In this way, a spurious noise pattern may not be produced in the VCO output OUT due to the averaging of the frequency dividing numbers over time.

Referring now to FIG. 23, a schematic diagram of a frequency dividing number control circuit is set forth and given the general reference number 2300. Frequency dividing number control circuit 2300 is configured as a three-stage first-order MASH, which includes sigma-delta modulators (1C, 2C, and 3C) cascaded in series, a weighting adder 4C, and an adder 5C. Each sigma-delta modulator (1C, 2C, and 3C) includes accumulators having an output provided as feedback through a delay stage D to an input. Weighting adder 4C adds the outputs of each sigma-delta modulator (1C, 2C, and 3C) either directly or through delay circuits D.

Each sigma-delta modulator (1C, 2C, and 3C) of three-stage first-degree MASH synchronously operates according to a clock (not shown). The clock has a period of the delay time of the delay circuit D. First stage sigma-delta modulator 1C accumulates input F in accumulator in accordance with the timing of the above-mentioned clock. When the accumulated value reaches M, first stage sigma-delta modulator 1C outputs an overflow signal and, at the same time, resets the accumulated value. As a result a signal of F/M is provided. Second and third stage sigma-delta modulators (2C and 3C) perform an accumulating operation according to outputs at each clock time of the first stage sigma-delta modulator 1C and second stage sigma-delta modulator 2C, respectively, an provide overflow signals and resetting in the same manner as the first stage sigma-delta modulator 1C.

Weighting adder 4C receives, with respect to the overflow signal from first stage sigma-delta modulator 1C, the overflow outputs of second and third stage sigma-delta modulators (2C and 3C) and their inverted signals after one or two clocks. Weighting adder 4C then performs a weighted addition of the overflow outputs. In this way, variations of the above F/M is randomized and the noise-shaping effect is provided. Adder 5C adds a value N to a value F/M and outputs signal sequence n on a time sequence basis.

In conventional N frequency synthesizer 2200, comparison signal SIG is locked in a steady state such that a phase difference between comparison signal SIG and reference signal REF may be near zero. In this way, VCO 4B oscillates at a frequency (N+F/M) times higher than reference signal REF and spurious pattern noise may be suppressed.

Japanese Patent Laid-Open No. 10-163860 discloses a PLL circuit using a phase comparison circuit (2) having an edge comparison function with a dead zone characteristic. The dead zone is a range in which a phase difference between a reference signal (REF) and a feedback signal (FDBK) is set as zero. This dead zone range is a given range close to zero. The PLL circuit of Japanese Patent Laid-Open No. 10-163860 also includes a frequency dividing-by-n circuit (6) (n is an integer greater than or equal to 1) and a modulator circuit (1). The modulator circuit (1) is provided on one side of either the reference signal (REF) or the feedback signal (FDBK). In this way, the occurrence of jitter in a VCO output (OUT) caused by the above-mentioned dead zone characteristic may be prevented even in a state of phase synchronization.

In a conventional fractional N frequency synthesizer, the frequency dividing circuit performs the operation of switching between a frequency dividing number N and N+1 according to the signal sequence n of dividing values on a time sequence basis. Thus, spurious pattern noise based on a time average value of the frequency dividing numbers is generated in the VCO output. However, this spurious pattern noise may be sufficiently suppressed by the frequency dividing number control having the noise shaping effect or the like as described above.

However, in a conventional fractional N frequency synthesizer, a phenomenon may exist that even the use of a frequency dividing number control as described above can leave spurious pattern noise. The frequency of this spurious component occurs at positions on higher and lower sides separated, with respect to the frequency (fvco) of the VCO output, by a frequency corresponding to a frequency difference between the frequency (fvco) and the Nth harmonic fref (fsig) of the reference signal REF. The cause of the occurrence of such a spurious pattern noise is believed to result from a portion of the VCO output sneaking into the input side of the phase comparison circuit through the package, a power supply line, a ground line, and/or other circuits on the board.

Referring now to FIG. 24, a spectral graph illustrating the frequency and power of the spurious pattern noise is set forth. FIG. 24($a$) is a spectral graph showing the frequency and power of the VCO output of a frequency synthesizer of integer multiplication. FIG. 24($b$) is a spectral graph showing the frequency and power of the VCO output of a fractional N frequency synthesizer.

As shown in FIG. 24($a$) the frequency (fvco) of the VCO output of the frequency synthesizer of integer multiplication (for example frequency synthesizer 2100 illustrated in FIG. 21) is an integer (N) times the frequency of (fref) of the reference signal REF that can be expressed by fvco=N×fref (fsig). In a state of phase synchronization, the frequency (fvco) is an integer N times the frequency (fsig) of the comparison signal SIG, but hereinafter, the description is done in relation to the frequency (fref) of the reference signal REF. Therefore, in conventional frequency synthesizer 2100 illustrated in FIG. 21, even if the VCO output sneaks into the input side of the phase comparison circuit, spurious pattern noise of a low frequency component may not be caused by the VCO output mixing with the reference signal REF.

On the other hand, in the case of a conventional fractional N frequency synthesizer performing frequency dividing by a non-integer, the frequency (fvco) of the VCO output is a non-integer (N+F/M) times the frequency (fref) of the reference signal REF as illustrated in FIG. 24($b$) (that is, fvco=(N+F/M)×fref (fsig)). Therefore, when the VCO output sneaks into the input side of the phase comparison circuit as a result of mixing with the reference signal REF, a frequency difference Δf between the VCO output and the Nth harmonic of the frequency (fref) of the reference signal REF occurs. This frequency component is present in a low frequency region, and this may be difficult to remove by filtering. That is, the signal component having the frequency difference Δf is included in the control signal of the VCO as is and becomes spurious pattern noise at a position separated from fvco by Δf at both a higher frequency and lower frequency in the frequency spectrum.

Referring now to FIG. 25, a graph of the spectrum of the VCO output in a small frequency range is set forth. The graph of FIG. 25 illustrates spurious noise occurring at F/M×fref, for example, 1/64×6.4 MHz=100 KHz offset in both a higher frequency and lower frequency from fvco (1280.1 MHz). This spurious noise degrades the noise characteristic of the frequency synthesizer. The spurious noise is noise of a basically different property than the above pattern noise and may not be removed by the frequency dividing number control providing a conventional noise shaping effect.

The official gazette of Japanese Patent Laid-Open No. 10-163860 discloses a PLL circuit in which the PLL circuit has a dead zone characteristic in which the phase comparison output of a phase comparison circuit becomes zero in proximity of phase difference zero even in a state of phase lock. Thus, negative feedback control may not function within the above dead zone and the occurrence of jitter in the VCO output may be prevented. However, this PLL circuit does not perform fractional control over the frequency dividing circuit, but continuously performs dividing by an integer n (n is greater than or equal to 1). Therefore, the PLL circuit of Japanese Patent Laid-Open No. 10-163860 may not remove spurious noise caused by the occurrence of the above low frequency component. From the above description, it may be apparent that the jitter described in the above-mentioned official gazette is basically different from the low frequency component of spurious noise described above.

In view of the above discussion, it would be desirable to provide a fractional N frequency synthesizer that may prevent spurious noise in the VCO output caused by the VCO output sneaking into the input side of a phase comparison circuit. It would also be desirable to provide a fractional N frequency synthesizer that may prevent spurious noise over all the range of decimal values of the non-integer frequency dividing numbers.

SUMMARY OF THE INVENTION

According to the present embodiments, a frequency synthesizer that may have reduced spurious noise caused by a voltage controlled oscillator (VCO) output sneaking into an input side of a phase comparison circuit is disclosed. A beat frequency component may be generated by mixing of a portion of a VCO output sneaking into an input side of a phase comparison circuit through a reference signal or a comparison signal may be shifted to a high frequency region by providing a modulator circuit on a reference signal side or a comparison signal side. Thus, a low pass filter circuit may provide attenuation to the spurious noise. In this way, spurious noise in the VCO output may be reduced.

According to one aspect of the embodiments, a fractional N frequency synthesizer may control an oscillation frequency of a voltage controlled oscillator output of a voltage controlled oscillator essentially based on a phase difference between a comparison signal and a modulated reference signal. A fractional N frequency synthesizer may include a first frequency dividing circuit, a frequency dividing number control circuit, a modulating circuit, a phase comparison circuit, and a low pass filter. A frequency dividing circuit may receive a voltage controlled oscillator output and may provide a comparison signal by dividing a voltage controlled oscillator output by a first frequency dividing number. A frequency dividing number control circuit may control the first frequency dividing number of the first frequency dividing circuit to a non-integer value to provide the comparison signal. A modulating circuit may receive a reference signal and may provide the modulated reference signal having a first predetermined modulation width every T periods. T may be an integer greater than equal to 2. A phase comparison circuit may receive the modulated reference signal and the comparison signal and may provide a phase difference signal based on a phase difference between the modulated reference signal and the comparison signal. A low pass filter may receive the phase error signal and may provide a low frequency component of the phase difference signal to the voltage controlled oscillator.

According to another aspect of the embodiments, the modulated reference signal may be modulated by the first predetermined modulation width with respect to the reference signal every T periods. The modulating circuit may include a delay circuit, a selector control circuit, and a selector circuit. A delay circuit may receive the reference signal and may provide a delayed reference signal that may be essentially delayed by the first predetermined modulation width. A selector control circuit may provide a selector control signal. A selector circuit may receive the selector control signal and may select the reference signal or the delayed reference signal to provide the modulated reference signal.

According to another aspect of the embodiments, the selector control circuit may include a counter. The counter may receive the delayed reference signal and may provide the selector control signal by essentially dividing the frequency of the delayed reference signal by 2.

According to another aspect of the embodiments, the modulation circuit may include a second frequency dividing circuit and a modulation control circuit. A second frequency dividing circuit may receive the reference signal and may provide the modulated reference signal by providing a frequency division of the reference signal in accordance with a second frequency dividing number. A modulation control circuit may provide a different value for the second frequency dividing number once per T periods.

According to another aspect of the embodiments, a modulation control circuit may include a counter and a selector. A counter may receive the modulated reference signal and may provide a selector control signal by essentially dividing the frequency of the modulated reference signal by 2. A selector may select between a first number and a second number based on the selector control signal to provide the second frequency dividing number.

According to another aspect of the embodiments, a modulation control circuit may include an adder. The adder may add a selector output and a base frequency dividing number to provide the second frequency dividing number. A selector may provide the selector output.

According to another aspect of the embodiments, a modulating circuit may selectively provide the modulated reference signal as the reference signal or the reference signal modulated by essentially the first predetermined width ever T periods.

According to another aspect of the embodiments, the modulating circuit may provide the modulated reference signal as the reference signal modulated by a second predetermined modulation width or the reference signal modulated by essentially the first predetermined modulation width every T periods.

According to another aspect of the embodiments, the modulating circuit may provide the modulated reference signal having a different predetermined modulation width every T periods. T may be an integer greater than or equal to 2.

According to another aspect of the embodiments, the modulating circuit may be a variable modulating circuit and may include a delay circuit. A delay circuit may receive the reference signal and may provide a different predetermined modulation width in accordance with the non-integer value.

According to another aspect of the embodiments, the frequency dividing number control circuit may control the first frequency dividing number on a time basis.

According to another aspect of the embodiments, the reference signal may be a periodic clock signal. The phase comparison signal may include a pulse width indicating a phase difference magnitude and a logic level indicating a phase direction.

According to another aspect of the embodiments, a fractional N frequency synthesizer may control an oscillation frequency of a voltage controlled oscillator output of a voltage controlled oscillator essentially based on a phase difference between a modulated comparison signal and a reference signal. A fractional N frequency synthesizer may include a first frequency dividing circuit, a frequency dividing number control circuit, a modulating circuit, a phase comparison circuit, and a low pass filter. A frequency dividing circuit may receive a voltage controlled oscillator output and may provide a comparison signal by dividing a voltage controlled oscillator output by a first frequency dividing number. A frequency dividing number control circuit may control the first frequency dividing number of the first frequency dividing circuit to a non-integer value to provide the comparison signal. A modulating circuit may receive the comparison signal and may provide the modulated comparison signal having a first predetermined modulation width every T periods. T may be an integer greater than or equal to 2. A phase comparison circuit may receive the reference signal and the modulated comparison signal and may provide a phase difference signal based on a phase difference between the reference signal and the modulated comparison signal. A low pass filter may receive the phase error signal and may provide a low frequency component of the phase difference signal to the voltage controlled oscillator.

According to another aspect of the embodiments, the modulated comparison signal may be modulated by the first predetermined modulation width with respect to the comparison signal every T periods. The modulating circuit may include a delay circuit, a selector control circuit, and a selector circuit. A delay circuit may receive the comparison signal and may provide a delayed comparison signal that may be essentially delayed by the first predetermined modulation width. A selector control circuit may provide a selector control signal. A selector circuit may receive the selector control signal and may select the comparison signal or the delayed comparison signal to provide the modulated comparison signal.

According to another aspect of the embodiments, the selector control circuit may include a counter. The counter may receive the delayed comparison signal and may provide the selector control signal by essentially dividing the frequency of the delayed comparison signal by 2.

According to another aspect of the embodiments, the modulating circuit may selectively provide the modulated comparison signal as the comparison signal or the comparison signal modulated by essentially the first predetermined modulation width every T periods.

According to another aspect of the embodiments, a fractional N frequency synthesizer may control an oscillation frequency of a voltage controlled oscillator output of a voltage controlled oscillator essentially based on a phase difference between a modulated comparison signal and a reference signal. A fractional N frequency synthesizer may include a first frequency dividing circuit, a modulation control circuit, a phase comparison circuit, and a low pass filter. A frequency dividing circuit may receive a voltage controlled oscillator output and may provide a modulated comparison signal by dividing a voltage controlled oscillator output by a first frequency dividing number. A modulation control circuit may change the first frequency dividing number of the first frequency dividing circuit every T periods. T may be an integer greater than or equal to 2. A phase comparison circuit may receive the reference signal and the modulated comparison signal and may provide a phase difference signal based on a phase difference between the reference signal and the modulated comparison signal. A low pass filter may receive the phase error signal and may provide a low frequency component of the phase difference signal to the voltage controlled oscillator.

According to another aspect of the embodiments, a frequency dividing number control circuit may provide a base frequency dividing number to the modulation control circuit.

According to another aspect of the embodiments, the modulation control circuit may include a selector control circuit, a selector circuit, and an adder. A selector control circuit may provide a selector control signal. A selector circuit may receive the selector control signal and may select a first number or a second number to provide a selector output. An adder may add the selector output and the base frequency dividing number to provide the first frequency dividing number.

According to another aspect of the embodiments, the selector control circuit may include a counter. The counter may receive the modulated comparison signal and may provide the selector control signal by essentially dividing the frequency of the modulated comparison signal by 2.

DETAILED DESCRIPTION OF THE EMBODIMENTS

Various embodiments of the present invention will now be described in detail with reference to a number of drawings.

Figure 1:
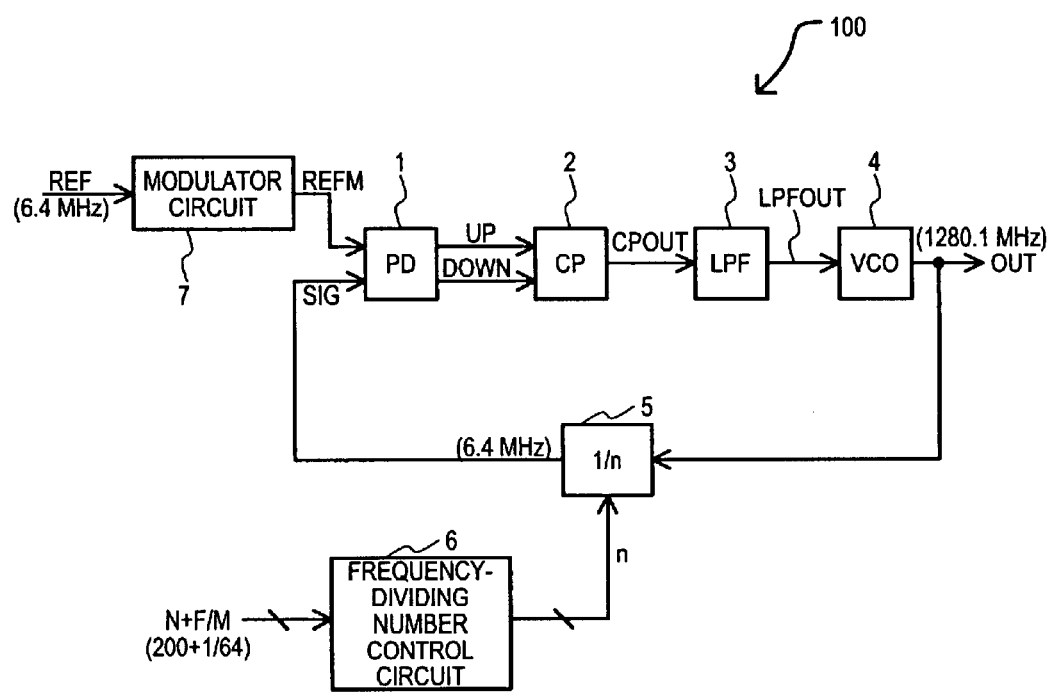
FIG. 1 is a circuit schematic diagram of a frequency synthesizer according to an embodiment.

Referring now to FIG. 1, a circuit schematic diagram of a frequency synthesizer according to an embodiment is set forth and given the general reference character 100.

Figure 22:
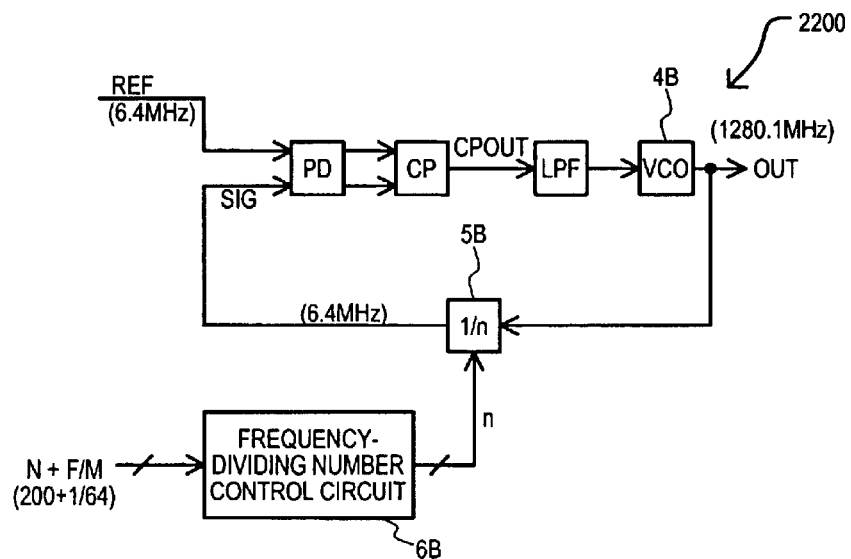
FIG. 22 is a block schematic diagram of a conventional N frequency synthesizer.
Figure 23:
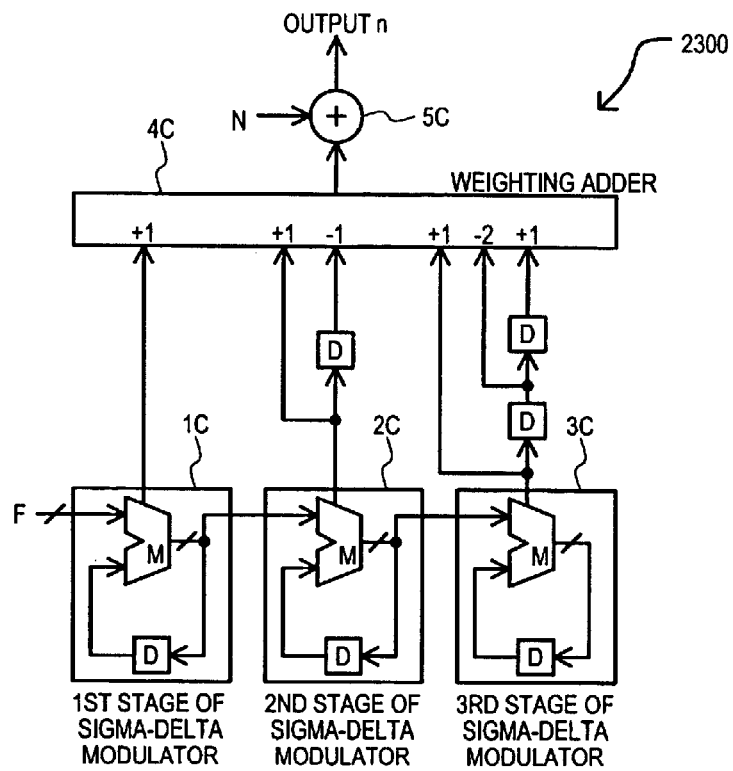
FIG. 23 is a schematic diagram of a frequency dividing number control circuit.
Figure 24:
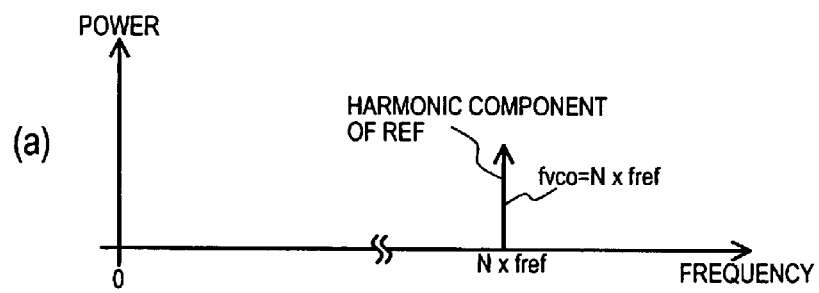
FIG. 24(a) is a spectral graph showing the frequency and power of the VCO output of a frequency synthesizer of integer multiplication.
FIG. 24(b) is a spectral graph showing the frequency and power of the VCO output of a fractional N frequency synthesizer.
Figure 24:
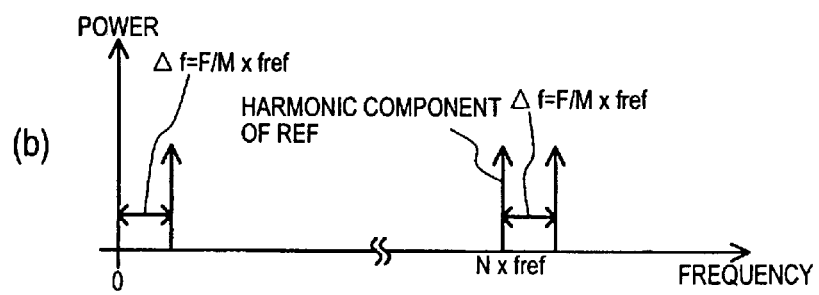
Figure 25:
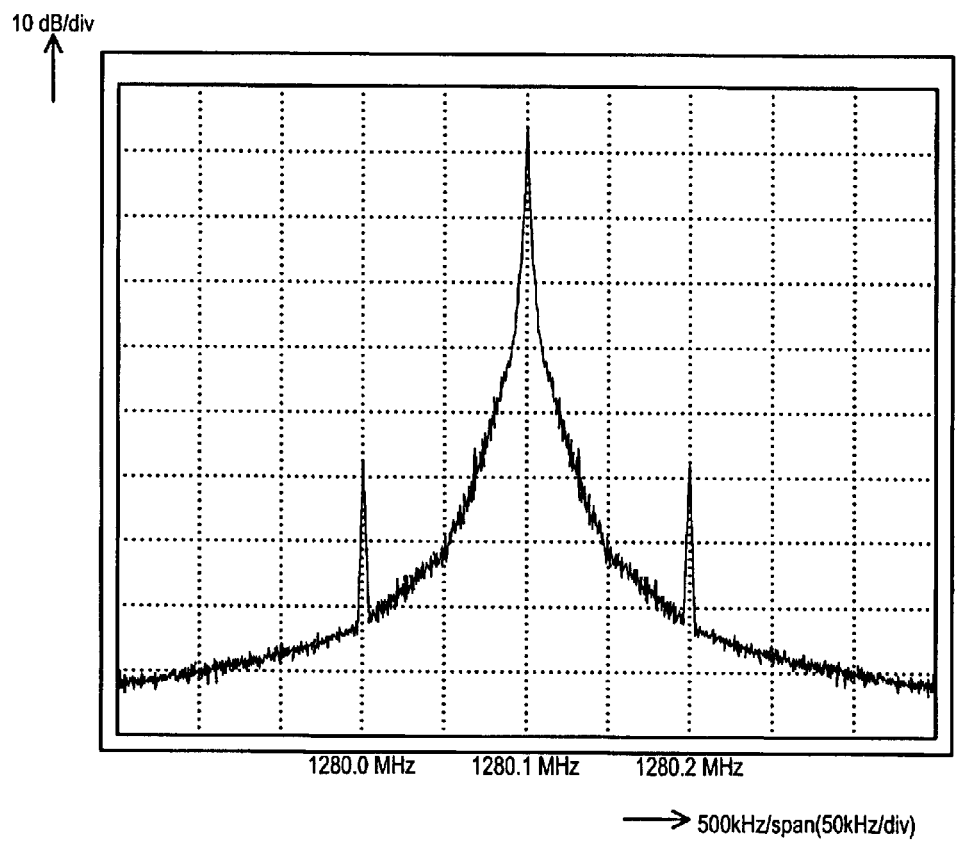
FIG. 25 is a graph of the spectrum of the VCO output in a small frequency range for a conventional fractional N frequency synthesizer.

Frequency synthesizer 100 may include similar constituents as conventional N frequency synthesizer 2200 of FIG. 22. Such constituents may be referred to by the same reference character.

Frequency synthesizer 100 may form a phase locked loop (PLL) circuit. The PLL circuit may include a phase comparison circuit 1, a charge pump circuit 2, a low pass filter (LPF) 3, a voltage controlled oscillator (VCO) 4, and a frequency dividing circuit 5. Frequency dividing circuit 5 may perform fractional control of a frequency division of an output signal OUT of VCO 4. A frequency dividing number control circuit 6 may provide a signal sequence n for controlling frequency dividing circuit 5. Frequency synthesizer 100 may include a modulator circuit 7.

Modulator circuit 7 may receive a reference signal REF and may provide a modulated (shifted) reference signal REFM as an output. Phase comparison circuit 1 may receive modulated reference signal REFM at one input and a comparison signal SIG at another input and may provide phase error signals (UP and DOWN) as outputs. Charge pump circuit 2 may receive phase error signals (UP and DOWN) and may provide a charge pump output CPOUT. LPF 3 may receive charge pump output CPOUT and may provide a low pass filter output LPFOUT. VCO 4 may receive the low pass filter output LPFOUT and may provide an output signal OUT. Frequency dividing circuit 5 may receive output signal OUT and signal sequence n and may provide comparison signal SIG. Frequency dividing number control circuit 6 may receive values (N, F, and M) and may provide signal sequence n.

Modulator circuit 7 may receive reference signal REF and periodically control the pulse position of reference signal REF to provide a modulated reference signal REFM. Modulator circuit 7 may shift a frequency of a beat component which may be caused by a component of output signal OUT sneaking into an input side (through reference signal REF or comparison signal SIG) of phase comparison circuit 1. Modulator circuit 7 may shift the frequency of the beat component to a high frequency region which may be outside the pass band frequency of low pass filter (LPF) 3. In this way, the beat component may be prevented from being included in low pass filter output LPFOUT used as a control signal for VCO 4.

Comparison signal SIG may be obtained by dividing output signal SIG with frequency dividing circuit 5. Phase comparison circuit 1 may detect a phase difference between comparison signal SIG and modulated reference signal REFM to provide phase error signals (UP and DOWN). Phase comparison signals (UP and DOWN) may be pulses which may be different in polarity in accordance to whether modulated reference signal REFM lags or leads phase comparison signal SIG. Pulse widths of phase comparison signals (UP and DOWN) may be determined by an amount (magnitude) of phase difference between comparison signal SIG and modulated reference signal REFM.

Charge pump 2 may provide a charge pump output CPOUT having a pulse width and polarity based on the phase comparison signals (UP and DOWN). LPF 3 may extract a low frequency component of charge pump output CPOUT to provide a low pass filter output LPFOUT. VCO 4 may provide an output signal OUT having an oscillation frequency according to low pass filter output LPFOUT. Frequency dividing circuit 5 may average frequency dividing numbers on a time basis based on a fractional control which, on a time basis, may switch among frequency dividing operations using frequency dividing numbers having a plurality of different integers according to a signal sequence n. Signal sequence n may be a frequency dividing number control signal provided by frequency dividing number control circuit 6. As a result, frequency dividing circuit 5 may perform frequency dividing of output signal OUT using a non-integer frequency dividing number to provide comparison signal SIG.

Frequency dividing number control circuit 6 may use a circuit having a noise shaping effect. For example, a sigma-delta modulator may be used in frequency dividing number control circuit 6 providing signal sequence n in order to remove spurious pattern noise which may occur from fractional control over frequency dividing circuit 5.

Figure 2:
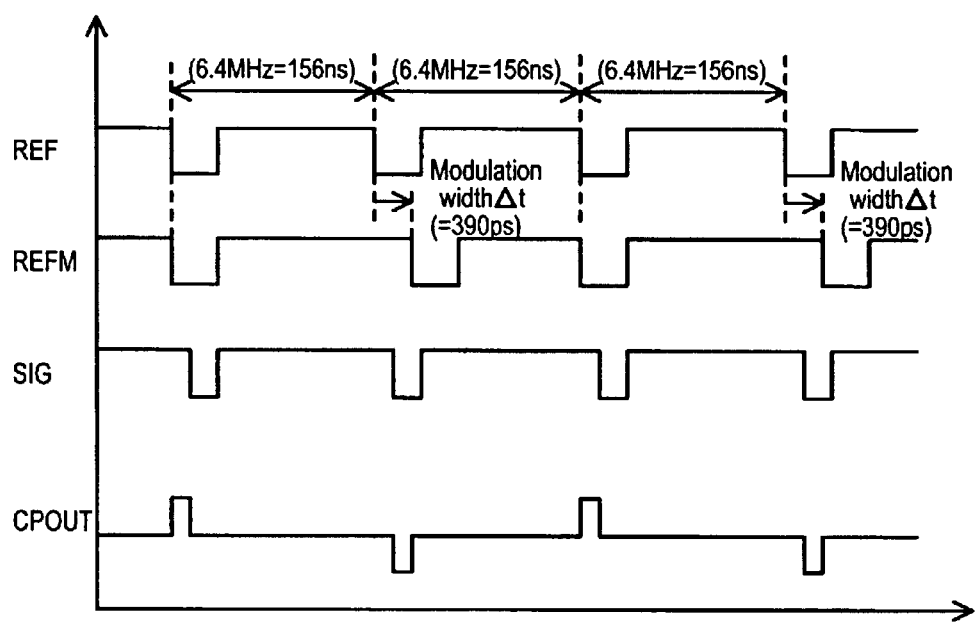
FIG. 2 is a timing diagram illustrating a basic operation of a frequency synthesizer according to an embodiment.

Modulator circuit 7 may receive reference signal REF and may modulate (shift) reference signal REF by a predetermined time width Δt in time every T cycles (for example, in FIG. 2, T=2). In this way, modulated (shifted) reference signal REFM may be generated. Phase comparison circuit 1 may receive modulated reference signal REFM at one input terminal. Frequency dividing circuit 5 may provide a reference comparison signal SIG which may be (1/(N+F/M)) times output signal OUT and may be obtained by controlling frequency dividing circuit 5 with a signal sequence n generated by frequency dividing number control circuit 6. Reference comparison signal SIG may be provided to another input of phase comparison circuit 1.

Referring now to FIG. 2, a timing diagram illustrating a basic operation of frequency synthesizer 100 according to an embodiment is set forth.

According to the embodiment, modulator circuit 7 may delay every other pulse of reference signal REF by Δt to provide periodically modulated signal REFM. Phase comparison circuit 1 may perform a phase comparison between modulated signal REFM and comparison signal SIG and provide a phase error signal (not shown) to charge pump circuit 2 and in this way, VCO 4 may be controlled through LPF 3.

In a usual PLL operation, reference signal REF and comparison signal SIG are feedback controlled so that edges of each signal may coincide with each other to provide a locked state. However according to the embodiment, because every other pulse of modulated signal REFM may be delayed with respect to reference signal REF, modulated signal REFM and comparison signal SIG may be controlled through feedback in a PLL so that respective average phases may coincide with each other to form a locked state. As a result, in the locked state, an edge of comparison signal SIG may be shifted (delayed) with respect to reference signal REF and may be alternate between being shifted (advanced) and shifted (delayed) with respect to modulated reference signal REFM. Thus, phase comparison circuit 1 may alternately provide a phase error signal that indicates a lag between modulated reference signal REFM and comparison signal SIG and a phase error signal that indicates a lead between modulated reference signal REFM and comparison signal SIG, each having a pulse width indicating a magnitude of phase difference.

Charge pump circuit 2 may provide a charge pump output CPOUT having a polarity which may alternate in accordance with the alternating phase comparison signals and having a pulse width which may indicate a magnitude of phase difference. As indicated in FIG. 2, when a phase of modulated reference signal REFM is delayed (lagging) with respect to comparison signal SIG, a charge pump output CPOUT may be a negative pulse. However, when a phase of modulated reference signal REFM is advanced (leading) with respect to comparison signal SIG, a charge pump output CPOUT may be a positive pulse. In each case, charge pump output CPOUT may have a pulse width indicating a magnitude of phase difference between modulated reference signal REFM and comparison signal SIG.

Next, the occurrence of spurious noise and the operation for removing spurious noise will be described in detail.

Figure 3:
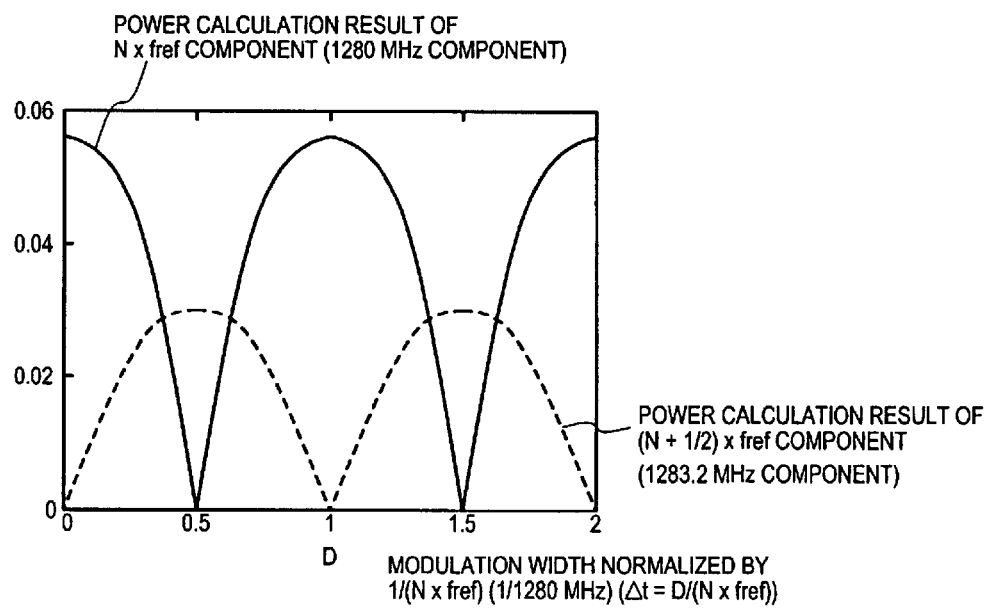
FIG. 3 is a graph for showing spectral characteristics of calculated results by a Fourier series expansion of a reference signal and a modulated reference signal according to a second embodiment.

Referring to FIG. 3, a graph for showing spectral characteristics of calculated results by a Fourier series expansion of reference signal REF and modulated reference signal REFM is set forth. The horizontal axis of FIG. 3 represents modulation widths ($\Delta t=D/(N \times fref)$) normalized by $1/(N \times fref)$. The vertical axis represents power levels of harmonics of each signal. For a better understanding, examples of concrete numerical values may also be added in the following description.

As shown in FIG. 3, when reference signal REF is modulated, the power of N×fref (solid line) may change in form in which each power (dotted line) of the component of N×fref and the component of (N+½)×fref has a period of time of 1/(N×fref) and a phase deviation of 180° from each other with respect to modulation width as a variable.

Figure 4:
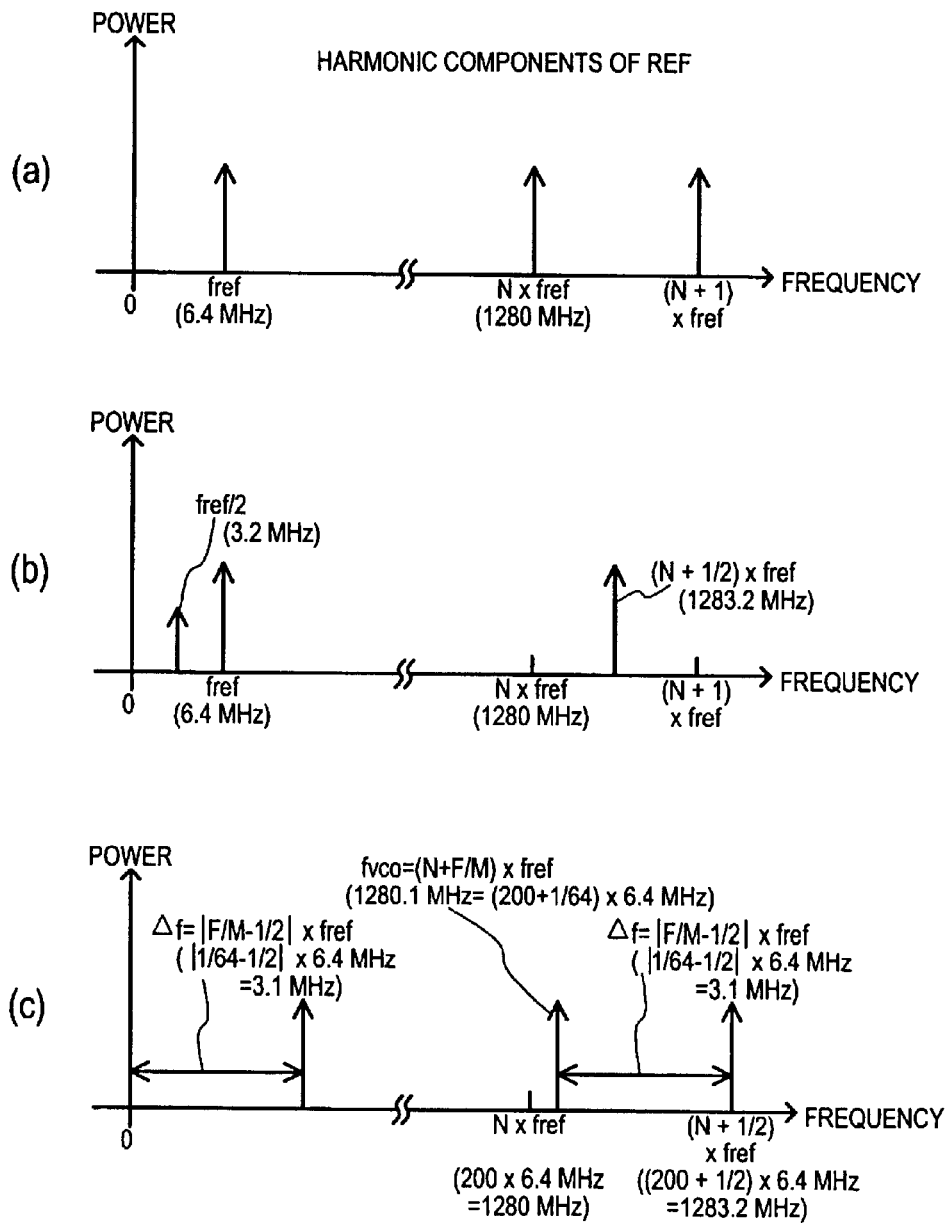
FIG. 4(a) is a spectral diagram showing frequency characteristics of a reference signal.
FIG. 4(b) is a spectral diagram showing frequency characteristics of a modulated reference signal when a modulation of $\Delta t=0.5/(N \times fref)$ is applied to a reference signal.
FIG. 4(c) is a spectral diagram showing frequency characteristic of the results of a phase comparison between a modulated reference signal and a comparison signal in a phase comparison circuit.

FIG. 4(a) is a spectral diagram showing frequency characteristics of reference signal REF. FIG. 4(b) is a spectral diagram showing frequency characteristics of modulated reference signal REFM when a modulation of $\Delta t=0.5/(N \times fref)$ is applied to reference signal REF. Although reference signal REF may consist of fundamental component fref and its harmonic components 2×fref, . . . (N−1)×fref, N×fref, in contrast, when attention is focused on low frequencies and Nth and N+1th harmonics, modulated reference signal REFM including frequency components of fref/2 and (N+½)×fref.

FIG. 4(c) is a spectral diagram showing frequency characteristic of the results of a phase comparison between modulated reference signal REFM and comparison signal SIG in phase comparison circuit 1. For example, if output signal OUT sneaks into comparison signal SIG a low frequency component of $\Delta f=|F/M-\frac{1}{2}| \times fref$ may appear at the output of phase comparison circuit 1. This may be due to a sneaking-in signal of a frequency fvco=(N+F/M)×fref and a component (N+½)×fref of modulated signal REFM being mixed with each other in phase comparison circuit 1.

From the above, the frequency of spurious noise may shift to $|F/M-\frac{1}{2}| \times fref$ because the power of a component of N×fref may attenuate and the power of the component of (N+½)×fref may increase by applying the above modulation to reference signal REF. In this way, spurious noise may become a problem when F/M is close to 0, where the frequency of spurious noise becomes low, or when F/M is close to 1. However, according to the embodiment, $|F/M-\frac{1}{2}| \times fref$ may be higher than N×fref and therefore may be attenuated by LPF 3.

Herein, when the modulation width $\Delta t$ is $(2p-1)/2$ times the period of output signal OUT (p is a natural number), the largest effect may be obtained. The effect may become smaller as one deviates from this modulation width. For the modulation width, a problem may not occur if it is possible to hold a relation such that the edges of the reference signals can synchronize with the comparison signal SIG once per T times. However, because the power of reference signal REF at 1/T×fref may be strong in proportion to the modulation width, the actual time limit to $\Delta t$ may be within a range in which this power can be sufficiently attenuated.

As described above, by shifting the frequency of spurious noise in an amount such as $|F/M-\frac{1}{2}| \times fref$, LPF 3 may sufficiently attenuate the spurious noise. In this way, spurious noise occurring in the output signal OUT of VCO 4 may decrease.

Figure 5:
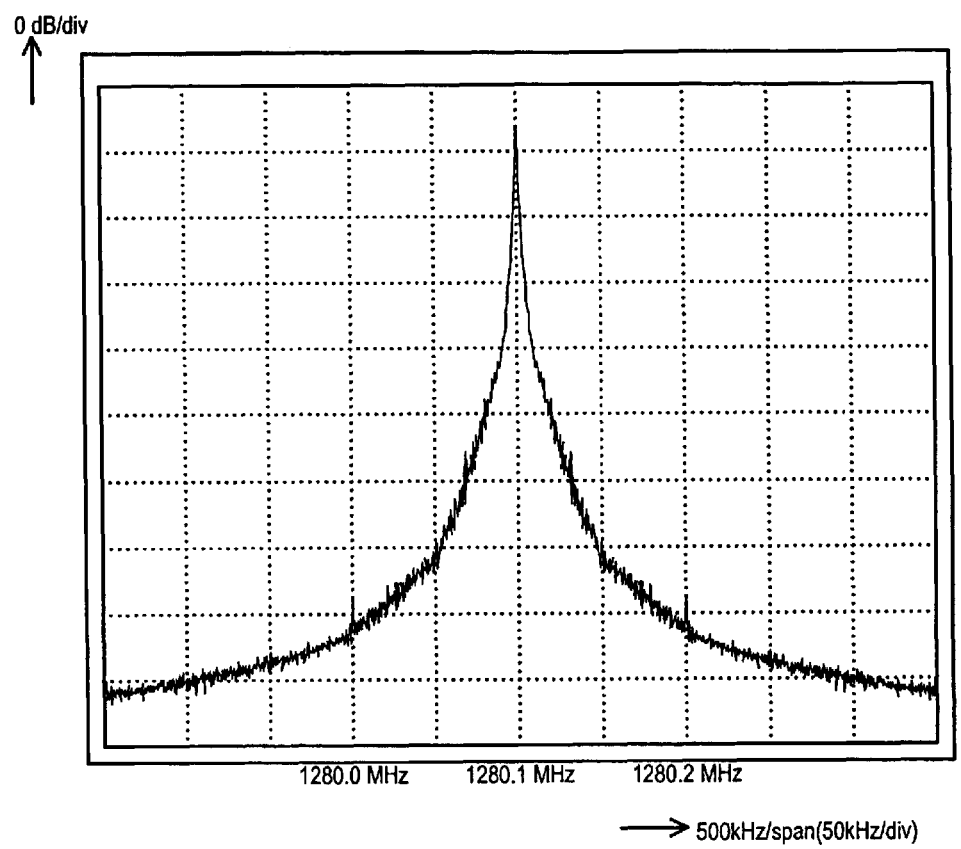
FIG. 5 is a graph of the spectrum of the a VCO output of a frequency synthesizer in a small frequency range according to an embodiment.

Referring now to FIG. 5, a graph of the spectrum of the VCO output (OUT) of frequency synthesizer 100 in a small frequency range according to an embodiment is set forth. FIG. 5 shows an example where spurious noise appearing at $\frac{1}{64} \times 6.4$ MHz=100 KHz has been attenuated by using a modulation width $\Delta t=0.5/(N \times fref)$ by modulator circuit 7.

Referring now to FIG. 6(a), a block schematic diagram of a modulator circuit according to an embodiment is set forth and given the general reference character 70. Modulator circuit 70 may be used as modulator circuit 7 in frequency synthesizer 100 of FIG. 1.

Modulator circuit 70 may include a delay circuit 71, a selector 72, and a counter 73. Delay circuit 71 may receive reference signal REF and may provide a delayed reference signal REFD. Selector 72 may receive reference signal REF at one input, delayed reference signal REFD at another input, and a selection signal RSEL at a control input and may provide modulated reference signal REFM as an output. Counter 73 may receive delayed reference signal REFD and may provide selection signal RSEL.

FIG. 6(b) is a block schematic diagram of counter 73 according to an embodiment. Counter 73 may be a D type flip-flop and may receive delayed reference signal REFD at a clock input C and may provide selection signal RSEL at an output Q and may have an inverted output QB connected to an input D.

Figure 6:
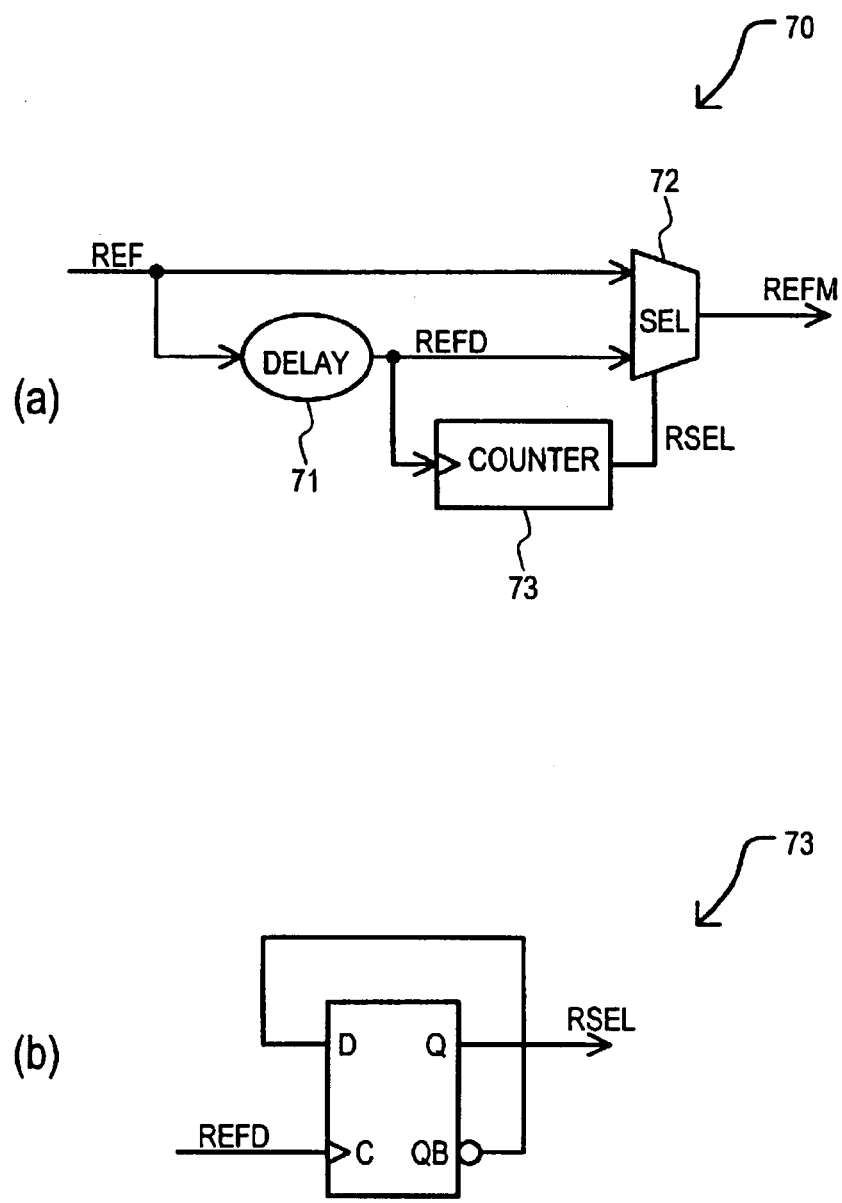
FIG. 6(a) is a block schematic diagram of a modulator circuit according to an embodiment.
FIG. 6(b) is a block schematic diagram of a counter according to an embodiment.
Figure 7:
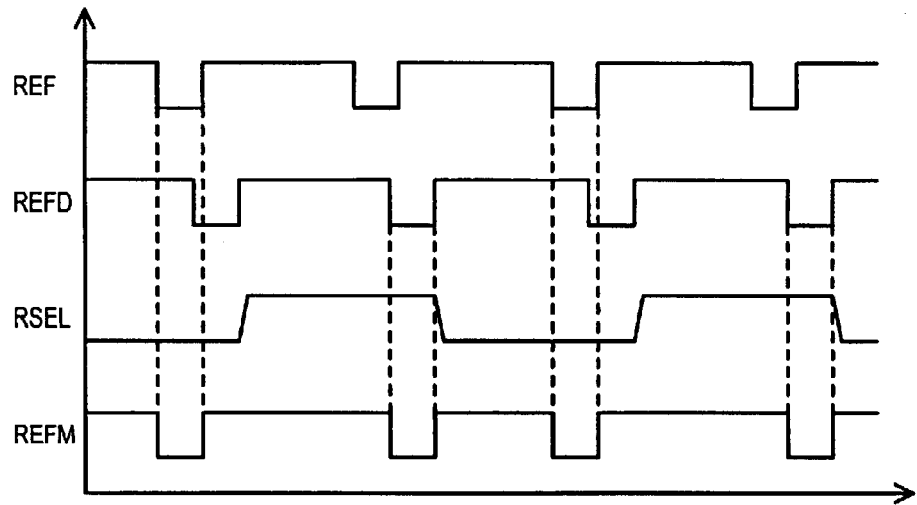
FIG. 7 is a timing diagram illustrating the operation of a modulator circuit of FIG. 6.

FIG. 7 is a timing diagram illustrating the operation of modulator circuit 70 of FIG. 6. A description of the operation of modulator circuit 70 will now be given with reference to FIG. 6 in conjunction with FIG. 7.

Delayed circuit 71 may provide a delay equivalent to a predetermined modulation width $\Delta t$ and provides a delayed reference signal REFD. Counter 73 may count delayed reference signal REFD and may perform a ½ frequency division to provide selection signal RESL. Selector 72 may select reference signal REF when selection signal RESL has a first logic level (for example, a low logic level) and may select delayed reference signal REFD when selection signal has a second logic level (for example, a high logic level) to provide modulated reference signal REFM. In this way, every other pulse of modulated reference signal REFM may be delayed with respect to reference signal REF as illustrated in FIG. 2.

Figure 8:
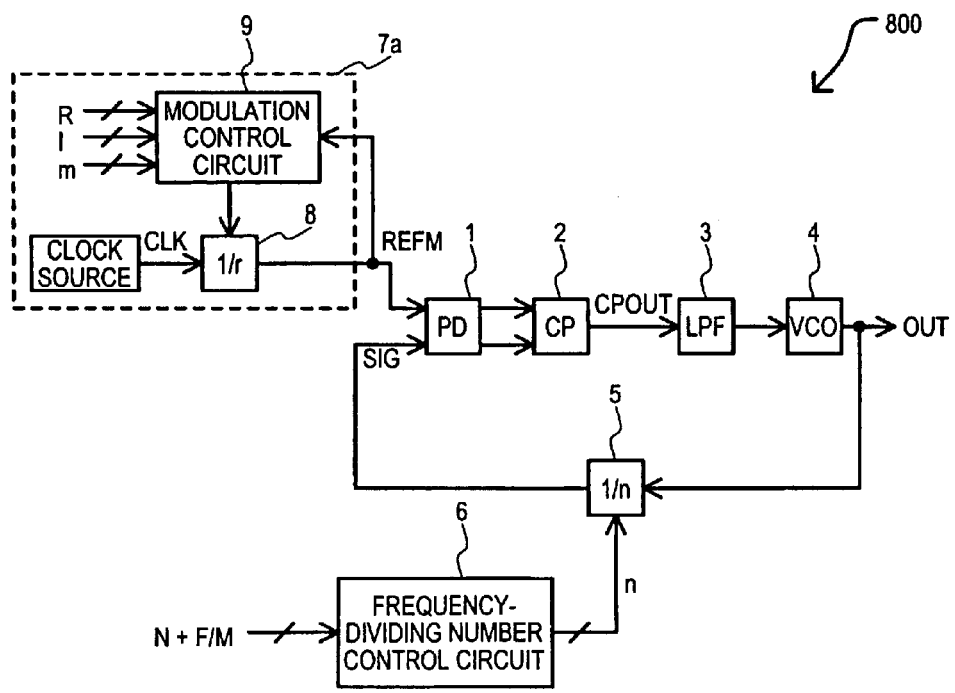
FIG. 8 is a circuit schematic diagram of a frequency synthesizer according to an embodiment.

Referring now to FIG. 8, a circuit schematic diagram of a frequency synthesizer according to an embodiment is set forth and given the general reference character 800. Frequency synthesizer 800 may include similar constituents as frequency synthesizer 100 of FIG. 1. Such constituents may be referred to by the same reference character.

Frequency synthesizer 800 may form a phase locked loop (PLL) circuit. The PLL circuit may include a phase comparison circuit 1, a charge pump circuit 2, a low pass filter (LPF) 3, a voltage controlled oscillator (VCO) 4, and a frequency dividing circuit 5. Frequency dividing circuit 5 may perform fractional control of a frequency division of an output signal OUT of VCO 4. A frequency dividing number control circuit 6 may provide a signal sequence n for controlling frequency dividing circuit 5. Frequency synthesizer 800 may differ from frequency synthesizer 100 of FIG. 1 in that frequency synthesizer 800 may include a modulator circuit 7a.

Modulator circuit 7a may include a frequency divider 8 and a modulation control circuit 9. Frequency divider 8 may receive a clock signal CLK from a clock source and may provide a 1/r frequency division to provide modulated reference signal REFM. Modulation control circuit 9 may receive values (R, 1, and m) and may control a frequency dividing number r of frequency divider 8.

In frequency synthesizer 800, modulation control circuit 9 may control frequency divider 8. Frequency divider 8 may operate to alternately repeat frequency dividing by (R+1) and frequency dividing by (R+m) (1 and m are integers). In this case, a value of Δt may become the period of clock signal multiplied by |1−m|/2. The period of modulated reference signal REFM may be essentially the period of reference signal REF frequency divided by (R+(1+m)/2). Value R may be conceptualized as a base frequency dividing number.

Figure 9:
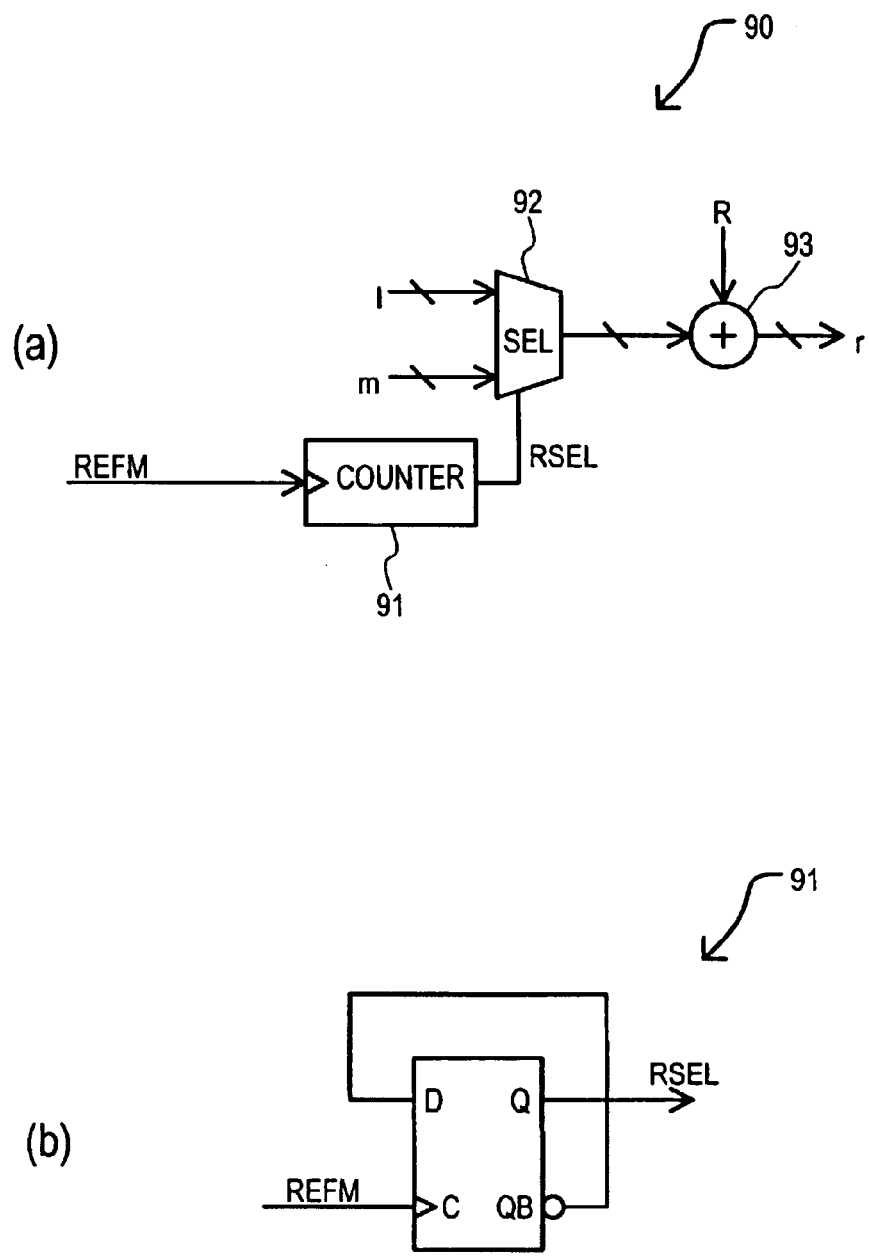
FIG. 9(a) is a block schematic diagram of a modulation control circuit according to an embodiment.
FIG. 9(b) is a block schematic diagram of a counter according to an embodiment.

Referring now to FIG. 9(a), a block schematic diagram of a modulation control circuit according to an embodiment is set forth and given the general reference character 90. Modulation control circuit 90 may be used as modulation control circuit 9 in frequency synthesizer 800.

Modulation control circuit 90 may include a counter 91, a selector 92, and an adder 93. Counter 91 may receive modulated reference signal REFM and may provide a select control signal RSEL. Selector 92 may receive value 1 and value m as inputs and may receive select control signal RSEL at a selector control terminal and may provide a selector output of either value 1 or value m in accordance with a logic level of select control signal RSEL. Adder 93 may receive the output of selector 92 and value R as inputs and may provide frequency dividing number r as an output.

FIG. 9(b) is a block schematic diagram of counter 91 according to an embodiment. Counter 91 may be a D type flip-flop and may receive modulated reference signal REFM at a clock input C and may provide select control signal RSEL at an output Q and may have an inverted output QB connected to an input D. Counter circuit 91 may operate as a ½ frequency dividing circuit.

Figure 10:
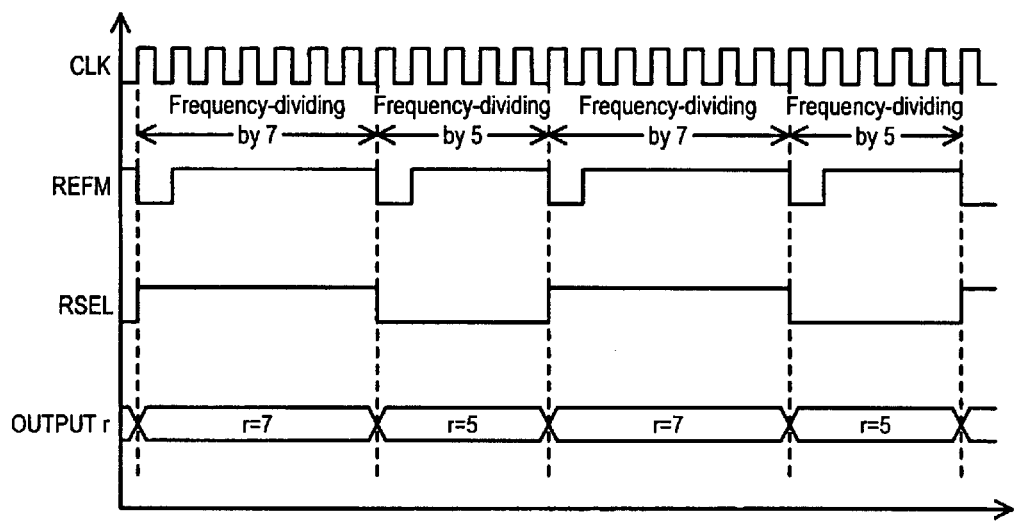
FIG. 10 is a timing diagram illustrating the operation of a modulator circuit of FIG. 8.

FIG. 10 is a timing diagram illustrating the operation of modulator circuit 7a of FIG. 8. FIG. 10 may illustrate a case where values are (R=6, 1=−1, and m=+1). A description of the operation of modulator circuit 7a will now be given with reference to FIG. 10 in conjunction with FIGS. 8 and 9.

Counter 91 may count low logic level pulses of modulated reference signal REFM provided by frequency divider 8 and may provide a select control signal RSEL. Select control signal RSEL may toggle (switch logic levels) for each low logic level pulse of modulated reference signal REFM counted. Selector circuit 92 may select m=−1 as an output when select control signal RSEL has a high logic level and may select 1=+1 as an output when select control signal RSEL has a low logic level. The output of selector circuit 92 may be added to value R=6 by adder 93 to provide frequency dividing number 4. In this case, frequency dividing number r may be switched between (r=7) and (r=5) as illustrated in FIG. 10. By doing so, a frequency dividing circuit 8 may receive a clock CLK and may provide a modulated reference signal REFM in accordance with a frequency dividing number r as illustrated in FIG. 10. In this example, Δt may be one period of a clock CLK.

In the embodiments described above, a modulator circuit or the like may be provided on a reference signal REF side so that spurious noise caused by an output signal OUT of a VCO 4 sneaking into an input side of a phase comparison circuit 1 may be prevented. However, a beat may be caused by a mixing function in a phase comparison circuit 1 when an output signal OUT of a VCO 4 sneaks into either one or both of a reference signal REF and/or a comparison signal SIG. When an output signal OUT of a VCO 4 sneaks into both a reference signal REF and a comparison signal SIG, the above mixing effect may take place as (fref (reference signal side)+fvco)×(fsig (comparison signal side)+fvco). As a result, spurious noise may occur due to the same principle as previously described.

Also, by providing a modulator circuit or the like on a comparison signal SIG side of a phase comparison circuit 1 instead of a reference signal REF side, a beat frequency caused by a mixing of the harmonics of a comparison signal SIG and an output signal OUT of a VCO 1 may be shifted to a higher frequency side and the occurrence of spurious noise may be prevented.

Figure 11:
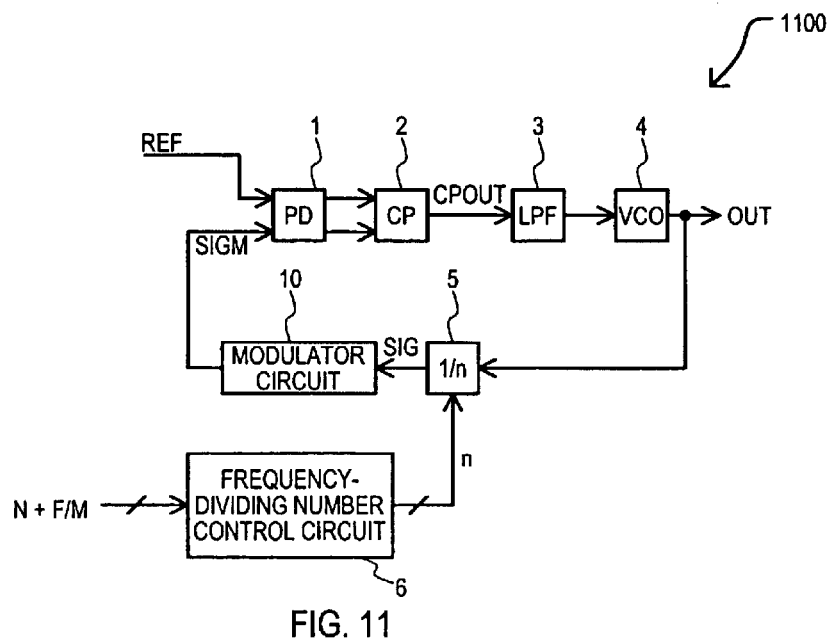
FIG. 11 is a circuit schematic diagram of a frequency synthesizer according to an embodiment.

Referring now to FIG. 11, a circuit schematic diagram of a frequency synthesizer according to an embodiment is set forth and given the general reference character 1100. Frequency synthesizer 1100 may include similar constituents as frequency synthesizer 100 of FIG. 1. Such constituents may be referred to by the same reference character.

Frequency synthesizer 1100 may form a phase locked loop (PLL) circuit. The PLL circuit may include a phase comparison circuit 1, a charge pump circuit 2, a low pass filter (LPF) 3, a voltage controlled oscillator (VCO) 4, a frequency dividing circuit 5, and a modulator circuit 10. Frequency dividing circuit 5 may perform fractional control of a frequency division of an output signal OUT of VCO 4. A frequency dividing number control circuit 6 may provide a signal sequence n for controlling frequency dividing circuit 5. Frequency synthesizer 1100 may differ from frequency synthesizer 100 of FIG. 1 in that frequency synthesizer 1100 may include a modulator circuit 10 placed in the path of a comparison signal SIG.

In frequency synthesizer 1100, modulator circuit 10 may receive comparison signal SIG and may provide a modulated comparison signal SIGM. Phase comparator 1 may receive a reference signal REF and modulated comparison signal SIGM and may provide comparison signals.

Figure 12:
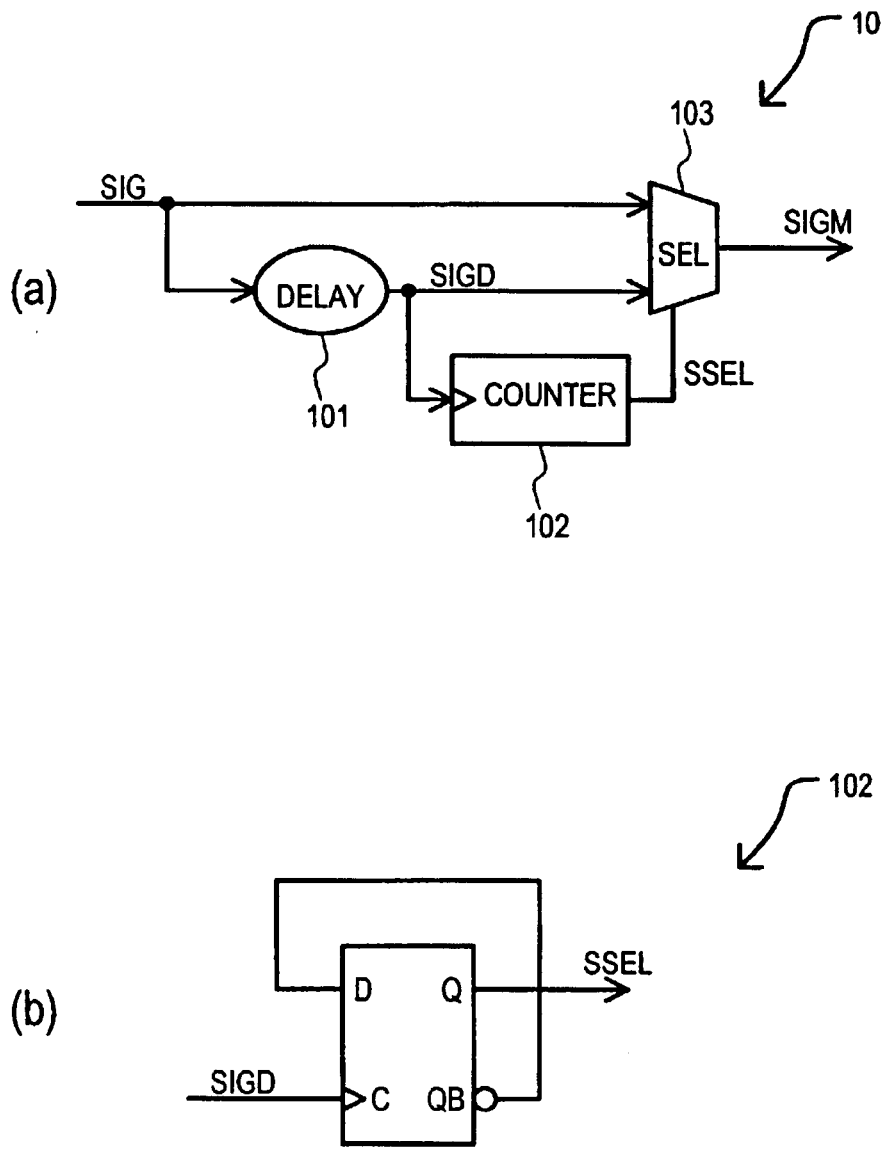
FIG. 12(a) is a block schematic diagram of a modulator circuit according to an embodiment.
FIG. 12(b) is a block schematic diagram of a counter according to an embodiment.

FIG. 12(a) is a block schematic diagram of a modulator circuit is set forth according to an embodiment and given the general reference character 10. Modulator circuit 10 may be used as modulator circuit 10 in frequency synthesizer 1200 of FIG. 12. Modulator circuit 10 may include delay circuit 101, a counter 102, and a selector 103. Delay circuit 101 may receive comparison signal SIG and may provide a delayed comparison signal SIGD. Counter 102 may receive delayed comparison signal SIGD and may provide a selection signal SSEL. Selector 103 may receive comparison signal SIG at one input, delayed comparison signal SIGD at another input, and selection signal SSELL at a control input and may provide modulated comparison signal SIGM as an output.

FIG. 12(b) is a block schematic diagram of counter 102 according to an embodiment. Counter 102 may be a D type flip-flop and may receive delayed comparison signal SIGD at a clock input C and may provide selection signal SSEL at an output Q and may have an inverted output QB connected to an input D. Counter 102 may provide a ½ frequency dividing output.

In frequency synthesizer 1100, comparison signal SIG or a delayed comparison signal SIGD may be alternately selected by selector 103 in accordance with a selection signal SSEL of counter 102 to be provided by modulator circuit 10 to provide modulated comparison signal SIGM. Thus, pulses of comparison signal SIG may be alternately time delayed and provided as modulated comparison signal SIGM to be compared with reference signal REF by phase comparator 1.

In this way, by providing a modulator circuit 10 or the like on a comparison signal SIG side of a phase comparison circuit 1 instead of a reference signal REF side, a beat frequency caused by a mixing of the harmonics of a comparison signal SIG and an output signal OUT of a VCO 1 may be shifted to a higher frequency side and the occurrence of spurious noise may be prevented.

Figure 13:
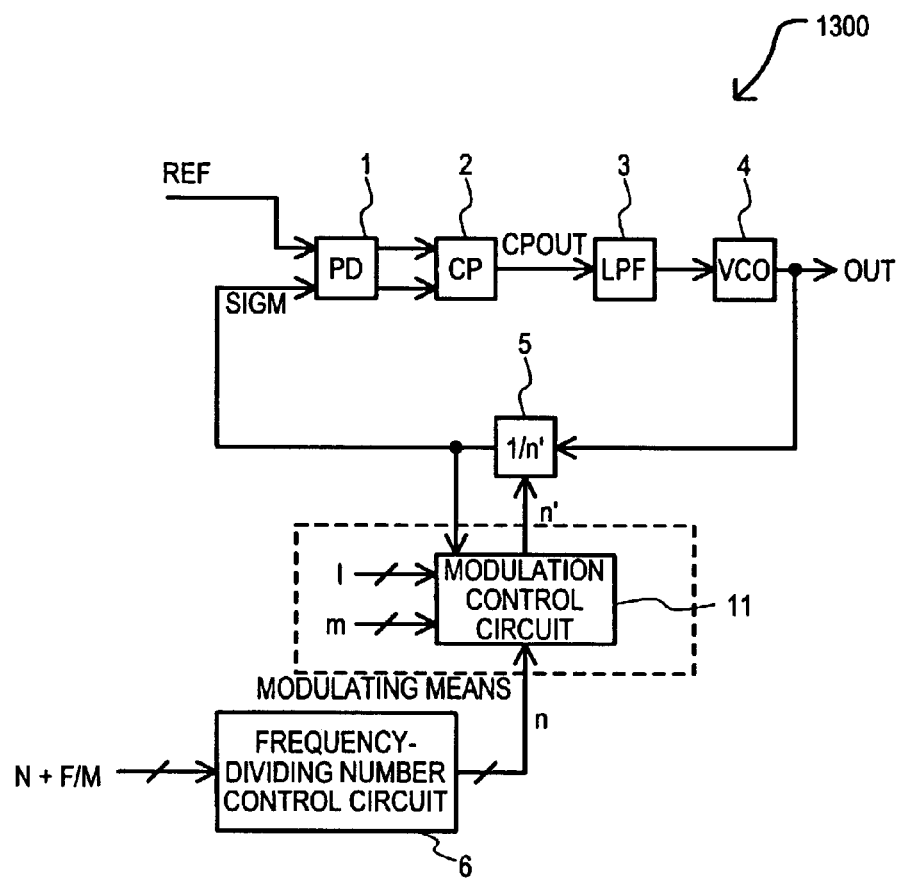
FIG. 13 is a circuit schematic diagram of a frequency synthesizer according to an embodiment.

Referring now to FIG. 13, a circuit schematic diagram of a frequency synthesizer according to an embodiment is set forth and given the general reference character 1300. Frequency synthesizer 1300 may include similar constituents as frequency synthesizer 100 of FIG. 1. Such constituents may be referred to by the same reference character.

Frequency synthesizer 1300 may form a phase locked loop (PLL) circuit. The PLL circuit may include a phase comparison circuit 1, a charge pump circuit 2, a low pass filter (LPF) 3, a voltage controlled oscillator (VCO) 4, and a frequency dividing circuit 5. Frequency dividing circuit 5 may perform fractional control of a frequency division of an output signal OUT of VCO 4.

Frequency synthesizer 1300 may differ from frequency synthesizer 100 of FIG. 1 in that frequency synthesizer 1300 may include a modulation control circuit 11. A frequency dividing number control circuit 6 may a signal sequence n (=N+F/M). Modulation control circuit 11 may receive values (1 and m) and signal sequence n and may provide a signal sequence n' which may alternate between (n+1) and (n+m).

Figure 14:
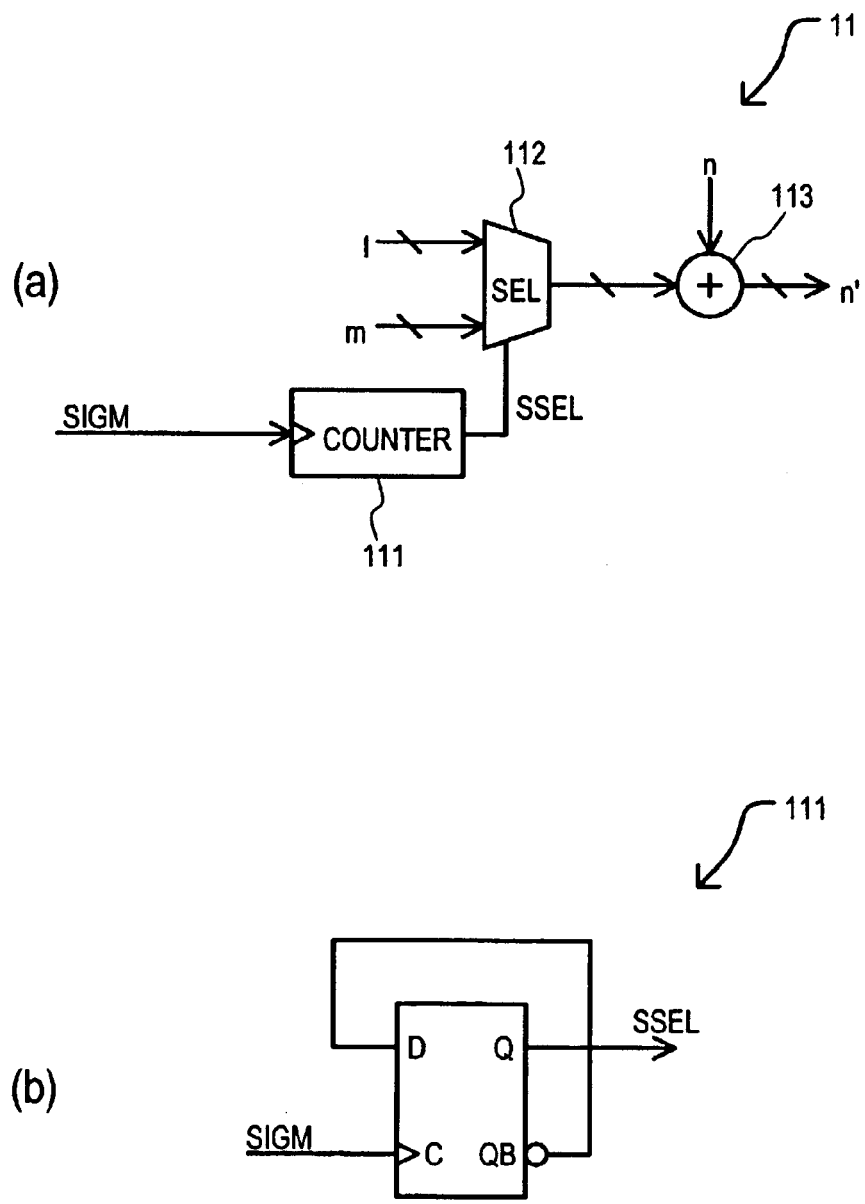
FIG. 14(a) is a block schematic diagram of a modulation control circuit according to an embodiment.
FIG. 14(b) is a block schematic diagram of a counter according to an embodiment.

FIG. 14(a) is a block schematic diagram of modulation control circuit 11 according to an embodiment. Modulation control circuit 11 may be used as modulation control circuit 11 in frequency synthesizer 1300. Modulation control circuit 11 may include a counter 111, a selection circuit 112, and an adder 113. Counter 111 may receive modulated comparison signal SIGM and may provide a select control signal SSEL. Selection circuit 112 may receive value 1 and value m as inputs and select control signal SSEL at a control input and may provide an output as either value 1 or value m in accordance with a logic level of select control signal SSEL. Adder 113 may sum signal sequence n and an output of selection circuit 112 to provide signal sequence n'. Signal sequence n' may be used for controlling frequency dividing circuit 5 (FIG. 13).

FIG. 14(b) is a block schematic diagram of counter 111 according to an embodiment. Counter 111 may be a D type flip-flop and may receive modulated comparison signal SIGM at a clock input C and may provide select control signal SSEL at an output Q and may have an inverted output QB connected to an input D. Counter 111 may provide a ½ frequency dividing output.

Each time modulated comparison signal SIGM is provided, selection circuit 112 may alternately provide value 1 and value m which may be added (by adder 113) to signal sequence n to determine signal sequence n'. In frequency synthesizer 1300, Δt may be |1−m|/2 times the period of output signal OUT provided by VCO 4.

In frequency synthesizer 1300, the period of modulated comparison signal SIGM may be the period of the signal output OUT of VCO 4 frequency divided by (n+(1+m)/2) and some combination of values (1 and m) may result in an offset (Δt). In order to compensate for this offset, it may be appropriate to add a predetermined value to an input value.

In frequency synthesizer 1300, signal sequence n may be conceptualized as providing a base frequency dividing number, which may be changed in accordance with modulation control circuit 12 to provide a varying frequency dividing number to frequency dividing circuit 5.

Figure 15:
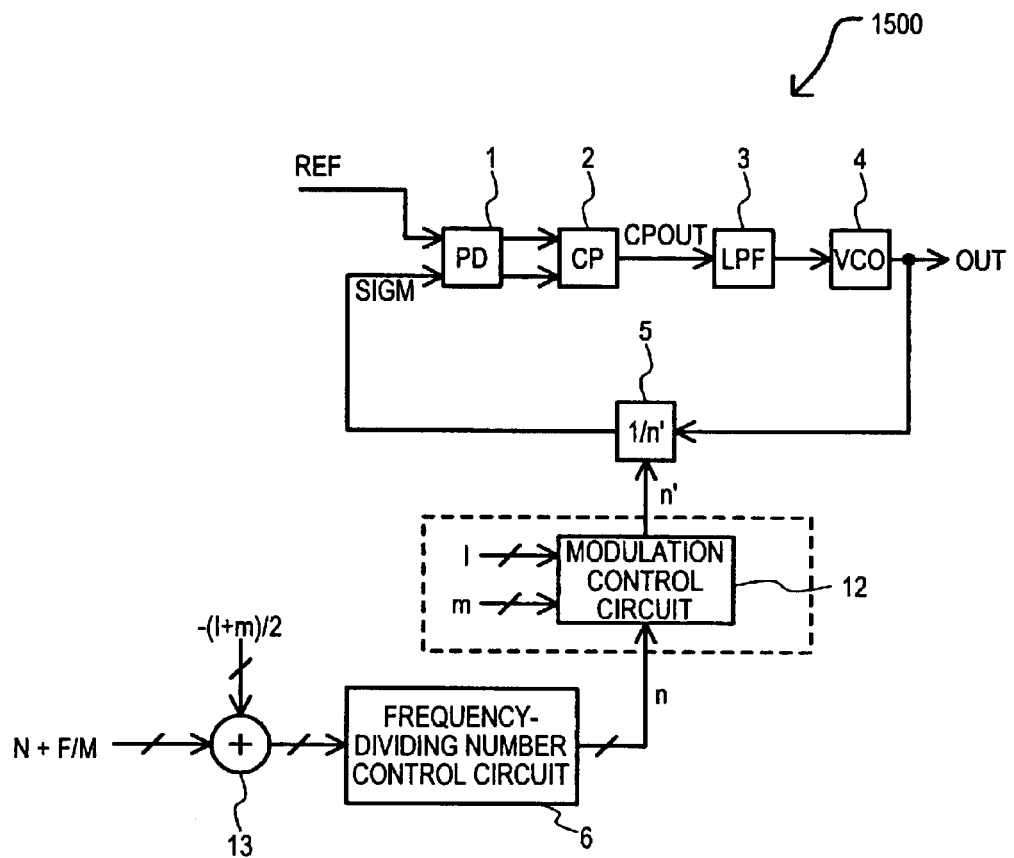
FIG. 15 is a block schematic diagram of a frequency synthesizer according to an embodiment.

Referring now to FIG. 15, a block schematic diagram of a frequency synthesizer according to an embodiment is set forth and given the general reference character 1500. Frequency synthesizer 1500 may differ from frequency synthesizer 1300 in that an adder 13 may be included. Adder 13 may be provided in the input portion of frequency dividing number control circuit 6 and a value −(1+m)/2 may be added to an input value (N+F/M) to provide offset compensation.

In the embodiments described above, it may be possible, in a desired non-integer range of F/M, to decrease an output signal OUT of a VCO 4 sneaking-in and providing spurious noise due to mixing. However, in order to realize a frequency synthesizer in which spurious noise caused by a low frequency component over all the non-integer range of 0<F/M<1 may be decreased and speedup of a lock time with low noise may be permitted, the operation of a modulator circuit may be configured to be switchable for reasons as follows.

A low frequency component may be generated by mixing to cause spurious noise. The low frequency component may be generated as a differential frequency between a sneaking in portion of a VCO output and a harmonic of a reference signal (comparison signal) and at the same time, the harmonic of the above reference signal (comparison signal) may shift toward a higher frequency side due to modulation. In this way, a differential frequency (fsp) generated by the mixing may actually change depending on the setting of F/M and the modulation width Δt.

For example, in frequency synthesizer 100 (FIG. 1), a harmonic component ((N+½)×fref component) of an odd multiple of fref/2 generated in modulated reference signal REFM may mix with the output signal OUT ((N+F/M)×fref component) of VCO 4 sneaking into an input side of phase comparison circuit 1. As a result, a frequency component Δf=|F/M−½|×fref may be output, thus causing spurious noise.

When 0<F/M<¼ and ¾<F/M<1, because ¼<|F/M−½|≦½, by applying a modulation of Δf above, Δf may become a component of a high frequency region equal to or higher than fref/4 as a result of mixing. In this way, spurious noise in the output signal OUT of a VCO 4 may decrease. On the other hand, when ¼≦F/M≦¾, because 0≦|F/M−½|≦¼, by applying a modulation of Δf above, Δf may become a component of a low frequency region equal to or lower than fref/4 as a result of mixing. In this way, spurious noise may be produced in output signal OUT of a VCO 4. That is, when ¼≦F/M≦¾, by applying a modulation, a component of a low frequency region equal to or lower than fref/4 may be generated and spurious noise characteristics may be degraded.

Figure 16:
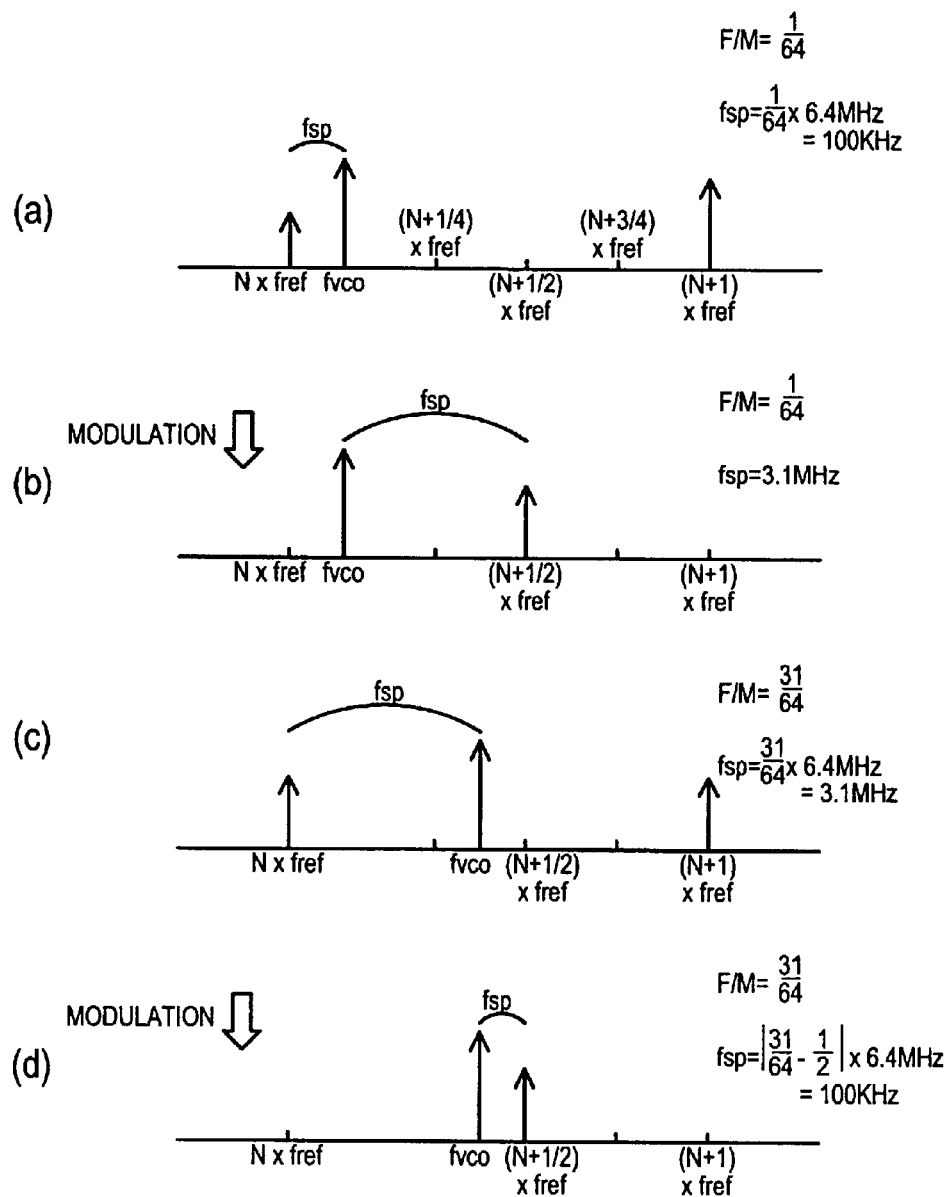
FIGS. 16(a)–(d) are graphs for illustrating the above-mentioned frequency relations using concrete numerical values.

FIGS. 16(a)–(d) are graphs for illustrating the above-mentioned frequency relations using concrete numerical values. FIG. 16(a) shows the case where N/M is near 0. A differential frequency (fsp) between a Nth harmonic of the reference signal un-modulated and a frequency (fvco) of an output signal OUT of a VCO 4 may be located in a low frequency region. However, by applying a modulation of a time width Δt to the differential frequency (fsp), the differential frequency (fsp) may be shifted to a high frequency region as shown in FIG. 16(b).

In contrast, FIG. 16(c) shows the case where F/M is near ½. A differential frequency (fsp) between a Nth harmonic of the reference signal un-modulated and a frequency (fvco) of an output signal OUT of a VCO 4 may be located in a high frequency region. However, by applying a modulation of a time width Δt to the differential frequency (fsp), the differential frequency (fsp) may be shifted to a low frequency region as shown in FIG. 16(d).

Figure 17:
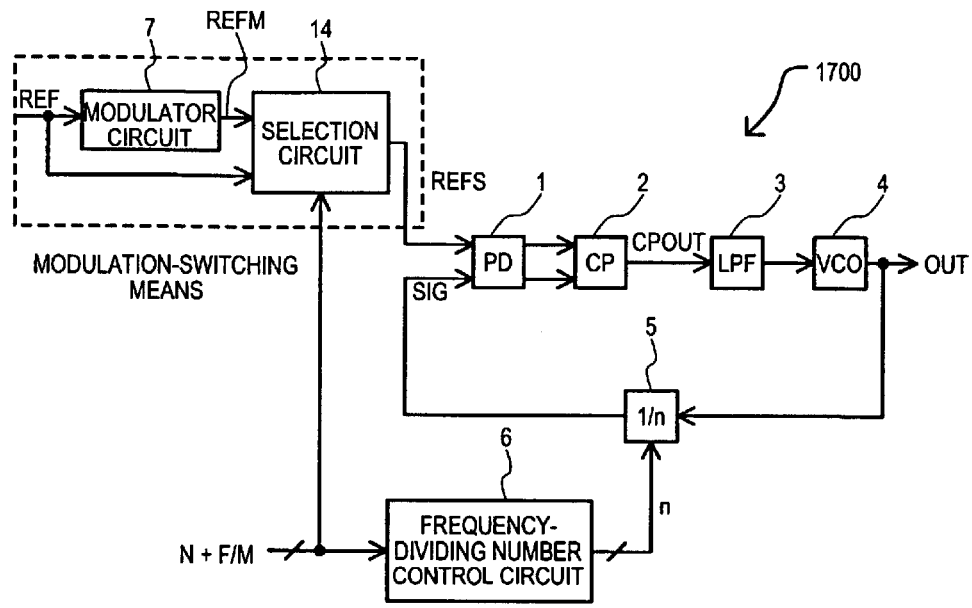
FIG. 17 is a block schematic diagram of a frequency synthesizer according to an embodiment.

Referring now to FIG. 17, a block schematic diagram of a frequency synthesizer according to an embodiment is set forth and given the general reference character 1700. Frequency synthesizer 1700 may include similar constituents as frequency synthesizer 100. Such constituents may be referred to by the same reference character. Frequency synthesizer 1700 may differ from frequency synthesizer 100 in that selection circuit 14 may be included between modulator circuit 7 and phase comparator 1.

Selection circuit 17 may receive modulated reference signal REFM at one input and reference signal REF at another input. Selection circuit may receive a value N+F/M as a control input and may provide a selected reference signal REFS. Selection circuit 17 may select either modulated reference signal REFM or reference signal REF in accordance with a value of F/M to provide selected reference signal REFS. By doing so, the occurrence of a component of a low frequency region equal to or lower than fref/4 over all the range of frequency dividing by a non-integer (fraction) of 0<F/M<1 may be suppressed. In this way characteristic degradation caused by spurious noise may decrease.

Selection circuit 14 may receive a value N+F/M. When ¼≦F/M≦¾, reference signal REF may be provided as selected reference signal REFS. When 0<F/M≦¼ or ¾<F/M≦1, selection circuit 7 may select modulated reference signal REFM as selected reference signal REFS.

Figure 18:
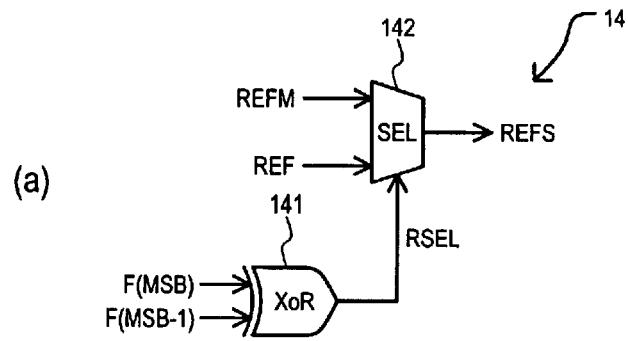
FIG. 18(a) is a circuit schematic diagram of a selection circuit is set forth according to an embodiment.
FIG. 18(b) is a truth table for a selection circuit of FIG. 18(a).

Referring now to FIG. 18(a), a circuit schematic diagram of selection circuit 14 is set forth according to an embodiment. FIG. 18(a) illustrates an example of fref=6.4 MHz, F=0–63, and M=64 of numerical values shown in FIG. 16. Selection circuit 14 may include an exclusive OR (XOR) 141 and a selector 142. XOR 141 may receive a most significant bit (MSB) and a MSB−1 among 6 bit data F and may provide a select signal RSEL. Selector 142 may receive modulated reference signal REFM, reference signal REF, and select signal RSEL and may provide selected reference signal REFS. FIG. 18(b) is a truth table for selection circuit 14 of FIG. 18(a). As illustrated in FIG. 18(b), selection circuit 14 may select reference signal REF when 16<N<48, otherwise, selection circuit 14 may select modulated reference signal REFM.

Figure 19:
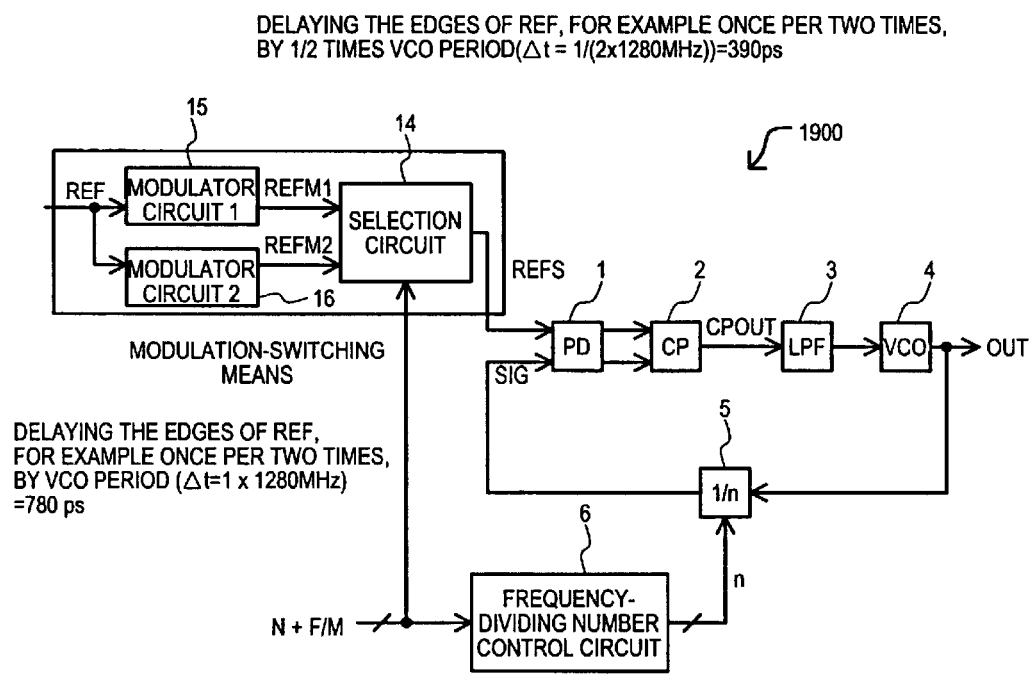
FIG. 19 is a block schematic diagram of a frequency synthesizer according to an embodiment.

Referring now to FIG. 19, a block schematic diagram of a frequency synthesizer according to an embodiment is set forth and given the general reference character 1900. Frequency synthesizer 1900 may include similar constituents as frequency synthesizer 100. Such constituents may be referred to by the same reference character. Frequency synthesizer 1900 may differ from frequency synthesizer 100 in that modulator circuits (15 and 16) and selection circuit 14 may be included instead of modulator circuit 7.

Modulator circuit 15 may receive reference signal REF and may provide modulated reference signal REFM1. Modulator circuit 16 may receive reference signal REF and may provide modulated reference signal REFM2. Selection circuit 14 may receive modulated reference signals (REFM1 and REFM2) and values (N+F/M) and may provide a selected modulated reference signal REFS. Phase comparator 1 may receive selected modulated reference signal REFS.

Modulator circuits (15 and 16) may be used to modulate the reference signal REF with different time widths to provide modulated reference signals (REFM1 and REFM2), respectively. The frequency of a region of a low frequency component caused my mixing may be appropriately adjusted in consideration of a relation between F/M and a modulation width Δt.

Referring now to FIG. 20(a), a block schematic diagram of a frequency synthesizer according to an embodiment is set forth and given the general reference character 2000. Frequency synthesizer 2000 may include similar constituents as frequency synthesizer 100. Such constituents may be referred to by the same reference character. Frequency synthesizer 2000 may differ from frequency synthesizer 100 in that a variable modulator circuit 17 may be included instead of modulator circuit 7.

Variable modulator circuit 17 may receive a reference signal REF and provide a modulated reference signal REFM. Variable modulator circuit 17 may arbitrarily change a modulation width Δt. Changing the modulation width Δt according to (N+F/M) may permit arbitrary controlling of a frequency range of a low frequency component caused by mixing according to an oscillation frequency of a VCO 4.

Referring now to FIG. 20(b), a circuit schematic diagram of variable modulator circuit 17 according to an embodiment is set forth. Variable modulator circuit 17 may include a digital to analog (D/A) converter circuit 171, a delay circuit 172, and a variable supply current 173. D/A converter circuit 171 may receive values (N and F) and may provide an output to control a current of variable supply current 173. Delay circuit 172 may receive a reference signal REF and provide a modulated reference signal REFM. Variable supply current 173 may provide a variable current to delay circuit 172 in accordance the output of D/A converter circuit 171. The amount of delay of delay circuit 172 may be controlled by a variable current from variable supply current 173 in accordance with the output of D/A converter 171 in order to modulate reference signal REF to provide modulated reference signal REFM. In this way, reference signal REF may be modulated to provide modulated reference signal REFM in accordance with values (N and F).

Figure 20:
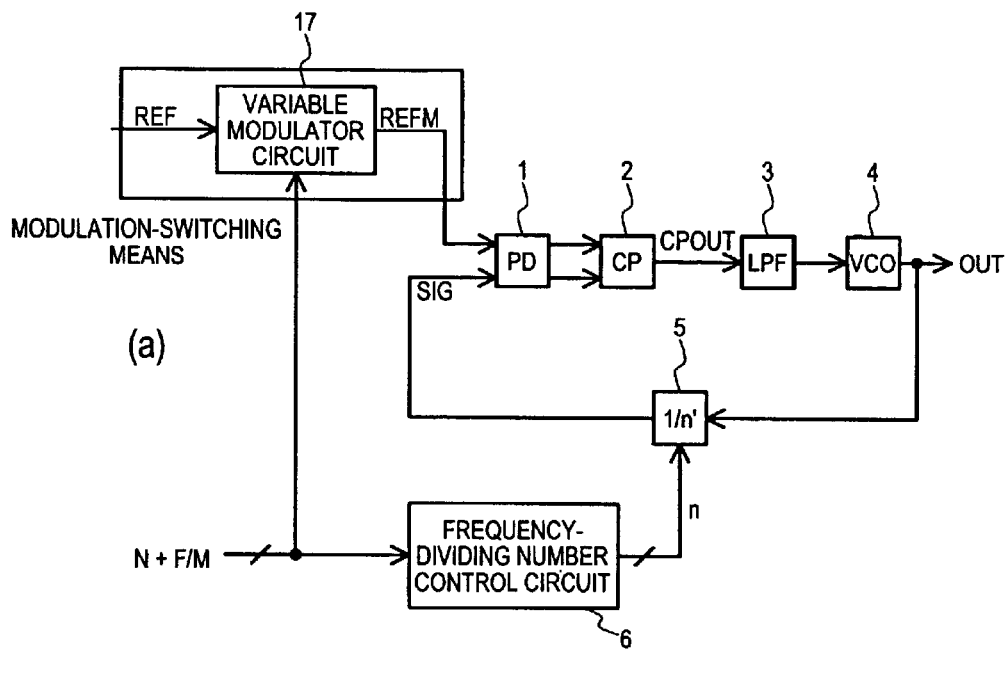
FIG. 20(a) is a block schematic diagram of a frequency synthesizer according to an embodiment.
FIG. 20(b) is a circuit schematic diagram of a variable modulator circuit according to an embodiment.
Figure 20:
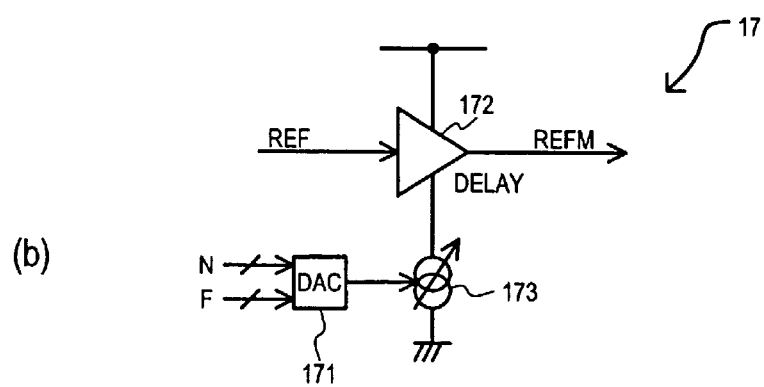
Figure 21:
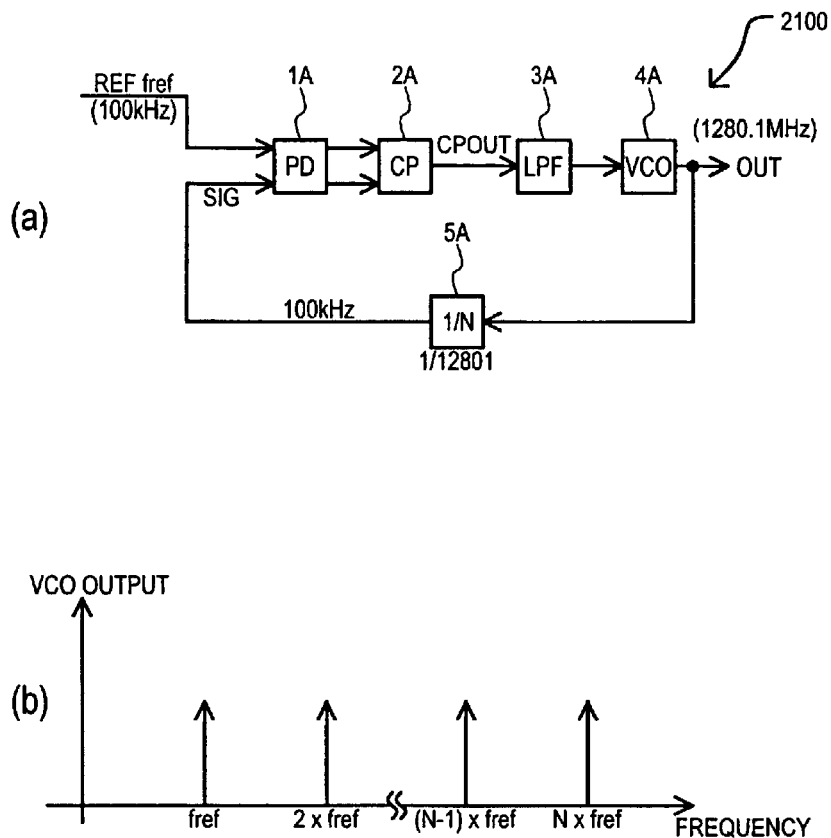
FIG. 21(a) is a block schematic diagram of a conventional N frequency synthesizer.
FIG. 21(b) is a frequency diagram indicating frequencies of an output signal set by setting a value of N of a conventional N frequency synthesizer.

Also, the embodiments of FIGS. 17, 19, and 20 for preventing spurious noise over a range of 0<F/M<1 may be applicable to frequency synthesizers shown in FIGS. 8, 11, and 13, as just a few examples. Further, reference signal REF and/or comparison signal SIG may provide modulated reference signal REFM and/or modulated comparison signal SIGM, respectively, by adopting a configuration for performing switching or modification of a modulation amount, or the like according to F/M. As just one example, modulated signals (REFM or SIGM) may be realized by providing a modulation switching means that may selectively output either an output of a frequency dividing circuit or an output obtained by modulating an output of a frequency dividing circuit by a predetermined time interval once every period above 2 according to a non-integer value as a set value of a frequency dividing circuit that may divide an oscillation output of a voltage controlled oscillator.

According to the embodiments, a frequency synthesizer (a fractional N frequency synthesizer) may have spurious noise suppressed in a VCO output caused by a low frequency component inherent to fractional control (PLL circuit of non-integer frequency dividing). This may be possible because the frequency of a VCO output may be a non-integer times the frequency of a reference signal or a comparison signal. The low frequency component may be generated on the output side of a phase comparison circuit. Even if a portion of a VCO output sneaks into a reference signal side or a comparison signal side through a package and board (via a power supply line, ground line, etc.), a signal component of a low frequency caused by mixing may be shifted to a high frequency region. Thus, a signal component generated on the output side of a phase comparison circuit may be sufficiently attenuated with a LPF circuit. Thus, spurious noise may not occur near the frequency of a VCO output. In this way, a fractional N frequency synthesizer with low spurious noise may be realized.

According to the embodiments, modulation on a reference signal or a comparison signal may be switched to modulated or un-modulated, or the amount of modulation may be controlled, according to a decimal value (fractional value) of a frequency dividing number of a non-integer. Thereby, over a range of 0<F/M<1, a low frequency signal component generated by mixing may be shifted to a signal component of a high frequency region. Thus, lock time of low noise and high speed over all of a range may be realized. As a result, if a fractional N frequency synthesizer according to the embodiments is applied, for example, as a transmitting/receiving frequency synthesizer, spurious noise generated in the proximity of a VCO output in all channels may be decreased.

It is understood that the embodiments described above are exemplary and the present invention should not be limited to those embodiments. Specific structures should not be limited to the described embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A fractional N frequency synthesizer controlling an oscillation frequency of a voltage controlled oscillator output of a voltage controlled oscillator essentially based on a phase difference between a comparison signal and a modulated reference signal, comprising:

a first frequency dividing circuit coupled to receive the voltage controlled oscillator output and providing the comparison signal by dividing the voltage controlled oscillator output by a first frequency dividing number;

a frequency dividing number control circuit for controlling the first frequency dividing number of the first frequency dividing circuit to a non-integer value to provide the comparison signal;

a modulating circuit coupled to receive a reference signal and providing the modulated reference signal having a first predetermined modulation width every T periods where T is an integer greater than or equal to 2;

a phase comparison circuit coupled to receive the modulated reference signal and the comparison signal and providing a phase difference signal based on a phase difference between the modulated reference signal and the comparison signal; and a low pass filter coupled to receive the phase error signal and providing a low frequency component of the phase difference signal to the voltage controlled oscillator.

2. The fractional N frequency synthesizer according to claim 1, wherein the modulated reference signal is modulated by the first predetermined modulation width with respect to the reference signal every T periods where T is an integer greater than or equal to 2 and the modulating circuit includes:

a delay circuit coupled to receive the reference signal and providing a delayed reference signal essentially delayed by the first predetermined modulation width;

a selector control circuit providing a selector control signal; and a selector circuit coupled to receive the selector control signal and selecting the reference signal or the delayed reference signal to provide the modulated reference signal.

3. The fractional N frequency synthesizer according to claim 2, wherein:

the selector control circuit includes a counter coupled to receive the delayed reference signal and providing the selector control signal by essentially dividing the frequency of the delayed reference signal by 2.

4. The fractional N frequency synthesizer according to claim 1, wherein the modulating circuit includes:

a second frequency dividing circuit coupled to receive the reference signal and providing the modulated reference signal by providing a frequency division of the reference signal in accordance with a second frequency dividing number; and a modulation control circuit providing a different value for the second frequency dividing number once per T periods.

5. The fractional N frequency synthesizer according to claim 4, wherein the modulation control circuit includes:

a counter coupled to receive the modulated reference signal and providing a selector control signal by essentially dividing the frequency of the modulated reference signal by 2; and a selector for selecting between a first number and a second number based on the selector control signal to provide the second frequency dividing number.

6. The fractional N frequency synthesizer according to claim 5, wherein the modulation control circuit includes:

an adder adding a selector output and a base frequency dividing number to provide the second frequency dividing number; and the selector providing the selector output.

7. The fractional N frequency synthesizer according to claim 1, wherein:

the modulating circuit selectively providing the modulated reference signal as the reference signal or the reference signal modulated by essentially the first predetermined modulation width every T periods.

8. The fractional N frequency synthesizer according to claim 1, wherein:

the modulating circuit selectively providing the modulated reference signal as the reference signal modulated by a second predetermined modulation width or the reference signal modulated by essentially the first predetermined modulation width every T periods.

9. The fractional N frequency synthesizer according to claim 1, wherein:

the modulating circuit providing the modulated reference signal having a different predetermined modulation width every T periods where T is an integer greater than or equal to 2.

10. The fractional N frequency synthesizer according to claim 9, wherein the modulating circuit is variable modulating circuit including:

a delay circuit coupled to receive the reference signal and providing the different predetermined modulation width in accordance with the non-integer value.

11. The fractional N frequency synthesizer according to claim 1, wherein:

the frequency dividing number control circuit controlling the first frequency dividing number on a time basis.

12. The fractional N frequency synthesizer according to claim 1, wherein:

the reference signal is a periodic clock signal; and the phase comparison signal includes a pulse width indicating a phase difference magnitude and a logic level indicating a phase direction.

13. A fractional N frequency synthesizer controlling an oscillation frequency of a voltage controlled oscillator output of a voltage controlled oscillator essentially based on a phase difference between a modulated comparison signal and a reference signal, comprising:

a first frequency dividing circuit coupled to receive the voltage controlled oscillator output and providing a comparison signal by dividing the voltage controlled oscillator output by a first frequency dividing number;

a frequency dividing number control circuit for controlling the first frequency dividing number of the first frequency dividing circuit to a non-integer value to provide the comparison signal;

a modulating circuit coupled to receive the comparison signal and providing the modulated comparison signal having a first predetermined modulation width every T periods where T is an integer greater than or equal to 2;

a phase comparison circuit coupled to receive the reference signal and the modulated comparison signal and providing a phase difference signal based on a phase difference between the reference signal and the modulated comparison signal; and a low pass filter coupled to receive the phase error signal and providing a low frequency component of the phase difference signal to the voltage controlled oscillator.

14. The fractional N frequency synthesizer according to claim 13, wherein the modulated comparison signal is modulated by the first predetermined modulation width with respect to the comparison signal every T periods where T is an integer greater than or equal to 2 and the modulating circuit includes:

a delay circuit coupled to receive the comparison signal and providing a delayed comparison signal essentially delayed by the first predetermined modulation width;

a selector control circuit providing a selector control signal; and a selector circuit coupled to receive the selector control signal and selecting the comparison signal or the delayed comparison signal to provide the modulated comparison signal.

15. The fractional N frequency synthesizer according to claim 14, wherein:

the selector control circuit includes a counter coupled to receive the delayed comparison signal and providing the selector control signal by essentially dividing the frequency of the delayed comparison signal by 2.

16. The fractional N frequency synthesizer according to claim 13, wherein:

the modulating circuit selectively providing the modulated comparison signal as the comparison signal or the comparison signal modulated by essentially the first predetermined modulation width every T periods.

17. A fractional N frequency synthesizer controlling an oscillation frequency of a voltage controlled oscillator output of a voltage controlled oscillator essentially based on a phase difference between a modulated comparison signal and a reference signal, comprising:

a first frequency dividing circuit coupled to receive the voltage controlled oscillator output and providing the modulated comparison signal by dividing the voltage controlled oscillator output by a first frequency dividing number that is a non-integer;

a modulation control circuit for changing the first frequency dividing number of the first frequency dividing circuit every T periods where T is an integer greater than or equal to 2;

a phase comparison circuit coupled to receive the reference signal and the modulated comparison signal and providing a phase difference signal based on a phase difference between the reference signal and the modulated comparison signal; and a low pass filter coupled to receive the phase error signal and providing a low frequency component of the phase difference signal to the voltage controlled oscillator.

18. The fractional N frequency synthesizer according to claim 17, further including:

a frequency dividing number control circuit providing a base frequency dividing number to the modulation control circuit.

19. The fractional N frequency synthesizer according to claim 18, wherein the modulation control circuit includes:

a selector control circuit providing a selector control signal;

a selector circuit coupled to receive the selector control signal and selecting a first number or a second number to provide a selector output; and an adder adding the selector output and the base frequency dividing number to provide the first frequency dividing number.

20. The fractional N frequency synthesizer according to claim 19, wherein:

the selector control circuit includes a counter coupled to receive the modulated comparison signal and providing the selector control signal by essentially dividing the frequency of the modulated comparison signal by 2.

* * * * *